United States Patent
Jung

(10) Patent No.: US 10,685,691 B2
(45) Date of Patent: Jun. 16, 2020

(54) STORAGE DEVICE

(71) Applicant: Samsung Electronics Co., Ltd., Suwon-si, Gyeonggi-do (KR)

(72) Inventor: Bong Kil Jung, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/380,514

(22) Filed: Apr. 10, 2019

(65) Prior Publication Data

US 2020/0090716 A1  Mar. 19, 2020

(30) Foreign Application Priority Data

Sep. 13, 2018 (KR) .................. 10-2018-0109474

(51) Int. Cl.
| | | |
|---|---|---|
| G11C 7/22 | (2006.01) | |
| G11C 11/00 | (2006.01) | |
| G11C 8/18 | (2006.01) | |
| H03K 3/03 | (2006.01) | |

(52) U.S. Cl.
CPC ............. G11C 8/18 (2013.01); H03K 3/0315 (2013.01)

(58) Field of Classification Search
CPC ....... G11C 7/222; G11C 11/4076; G11C 7/22; G11C 29/023; G11C 29/028; G11C 2207/2272; G11C 7/109; G11C 8/10; G11C 11/4096; G11C 11/4093
See application file for complete search history.

(56) References Cited

U.S. PATENT DOCUMENTS

| | | | | |
|---|---|---|---|---|
| 6,275,547 B1* | 8/2001 | Saeki | .................... | H04L 7/0338 |
| | | | | 375/354 |
| 7,872,493 B2* | 1/2011 | Kuwahara | ............ | G11C 7/1078 |
| | | | | 326/21 |
| 8,050,374 B2* | 11/2011 | Kim | ....................... | H03L 7/0812 |
| | | | | 375/354 |
| 2002/0176315 A1* | 11/2002 | Graaff | .................. | G11C 7/1066 |
| | | | | 365/233.1 |
| 2003/0112696 A1* | 6/2003 | Lee | .......................... | G11C 7/22 |
| | | | | 365/233.1 |
| 2006/0087909 A1* | 4/2006 | Okuda | ................... | G11O 5/025 |
| | | | | 365/210.1 |
| 2007/0234071 A1 | 10/2007 | Pyeon | | |

(Continued)

FOREIGN PATENT DOCUMENTS

JP      2015-046099      3/2015

*Primary Examiner* — Hien N Nguyen
(74) *Attorney, Agent, or Firm* — Harness, Dickey & Pierce, P.L.C.

(57) ABSTRACT

A storage device includes a first memory chip including a first input pad configured to receive a first input signal, a first initializing circuit configured to generate a first initializing signal, a first input delay circuit configured to delay the first input signal by a first time to generate a first output signal, a first output pad configured to receive the first output signal and output the first output signal, a first clock delay circuit configured to delay the first initializing signal by a second time to generate a first clock signal, a second clock delay circuit configured to delay the first clock signal by a third time to generate a second clock signal, a first latch configured to store the first input signal based on the first clock signal, and a second latch configured to store the first input signal based on the second clock signal.

19 Claims, 18 Drawing Sheets

(56) References Cited

U.S. PATENT DOCUMENTS

| | | | |
|---|---|---|---|
| 2008/0101522 A1* | 5/2008 | Ngo | G01R 31/318552 |
| | | | 375/372 |
| 2008/0191763 A1* | 8/2008 | Cho | H03K 5/1515 |
| | | | 327/158 |
| 2010/0280786 A1 | 11/2010 | Gorbold et al. | |
| 2012/0311297 A1 | 12/2012 | Lee et al. | |
| 2014/0015584 A1 | 1/2014 | Goel | |
| 2014/0068108 A1 | 3/2014 | Inoue et al. | |
| 2016/0170930 A1 | 6/2016 | Weng et al. | |
| 2017/0288656 A1* | 10/2017 | Cho | H03K 5/15013 |

* cited by examiner

STORAGE DEVICE

This application claims priority from Korean Patent Application No. 10-2018-0109474 filed on Sep. 13, 2018 in the Korean Intellectual Property Office, the disclosure of which is incorporated herein by reference in its entirety.

BACKGROUND

1. Field

Example embodiments of the present inventive concepts relate to a storage device.

2. Description of the Related Art

In order to construct a large-capacity storage device, a package may be formed by stacking a plurality of memory chips (for example, a NAND Flash, a PRAM, etc.). Since a plurality of memory chips commonly uses control signals which are input to the package, distinct chip addresses may be set for each memory chip in order to distinguish the respective memory chips. When the address is directly assigned to the address pads of each memory chip using the wire bonding, as the number of memory chips increases, the number of address pads and bonding wires may increase. When the number of address pads increases, since the size of the memory chip increases, it may be difficult to miniaturize the memory chip or the package. In addition, when the number of bonding wires increases, there is a high possibility of an occurrence of defects of the package.

SUMMARY

Example embodiments of the present inventive concepts provide a storage device with improved reliability and degree of integration of products.

According to some example embodiments of the present inventive concepts, a first memory chip may include a first input pad configured to receive a first input signal, a first initializing circuit configured to generate a first initializing signal, a first input delay circuit configured to set a first delay time based on the first initializing signal, and to delay the first input signal by the first delay time to generate a first output signal, a first output pad configured to receive the first output signal and output the first output signal to outside, a first clock delay circuit configured to delay the first initializing signal by a second delay time to generate a first clock signal, the second delay time being different from the first delay time, a second clock delay circuit configured to delay the first clock signal by a third delay time to generate a second clock signal, the third delay time being different from the second delay time, a first latch configured to store the first input signal based on the first clock signal, and a second latch configured to store the first input signal based on the second clock signal According to some example embodiments of the present inventive concepts, a storage device a controller; a first memory chip including a first address setting circuit configured to, receive an address setting command from the controller to generate a first initializing signal receive a signal from outside to generate a first input signal, set a first delay time based on the first initializing signal, delay the first input signal by the first delay time to generate a first output signal, delay the first initializing signal by a second delay time to generate a first clock signal, determine a first output time point based on the first clock signal, and output a level of the first input signal at the first output time point as a first value of a first address of the first memory chip; and a second memory chip including a second address setting circuit configured to receive the first output signal from the first address setting circuit.

According to some example embodiments of the present inventive concepts, a memory chip includes a first input pad configured to receive a first input signal; a first initializing circuit configured to provide a first initializing signal; a first input delay circuit configured to delay the first input signal based on the first initializing signal; a first ring oscillator configured to generate a first clock signal and a second clock signal such that the second clock signal is the first clock signal delayed by a first time; a first latch configured to store the first input signal based on the first clock signal; a second latch configured to store the first input signal based on the second clock signal; and a first clock controller configured to provide the first clock signal and the second clock signal to the first latch and the second latch, respectively.

However, example embodiments of the present inventive concepts are not restricted to the one set forth herein. The above and other example embodiments of the present inventive concepts will become more apparent to one of ordinary skill in the art to which the present inventive concepts pertain by referencing the detailed description of example embodiments of the present inventive concepts given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
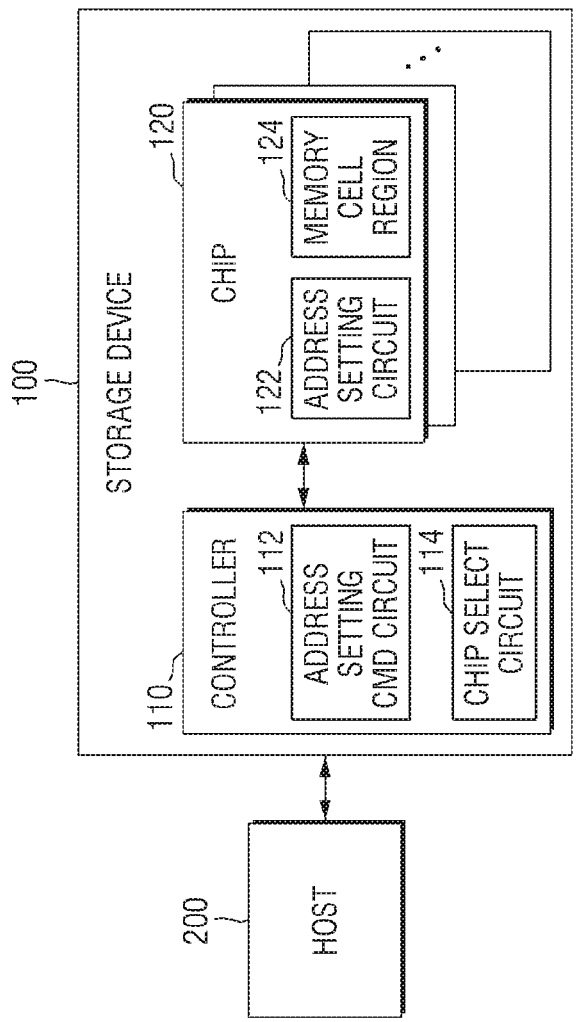
FIG. 1 is an example diagram for explaining a configuration of a data storage system according to some example embodiments.

FIG. 1 is an example diagram for explaining a configuration of a data storage system according to some example embodiments.

Referring to FIG. 1, the data storage system according to some example embodiments may include a storage device 100 and a host 200. The host 200 according to some example embodiments may transmit or receive data to and from or may transfer a command to the storage device 100. The host 200 may include user devices such as, for example, a personal/portable computer, a PDA, a PMP, and a MP3 player. The host 200 and the storage device 100 may be connected to each other by a host interface. The host interface may be, for example, a standardized interface such as an USB, a SCSI, an ESDI, a SATA, a SAS, a PCI-express or an IDE interface. The interface type for connecting the host 200 and the storage device 100 is not limited to a specific form and various modifications may be made.

The storage device 100 according to some example embodiments may be a solid state drive (SSD) which uses a flash memory, but embodiments are not limited thereto. For example, the storage device 100 may be a PC card (PCM-CIA), a compact flash card (CF), a smart media card (SM, SMC), a memory stick, a multimedia card (an MMC, a RS-MMC, and an MMC-micro), an SD card (an SD, a miniSD, a microSD, and an SDHC), an universal flash storage device (UFS), or the like.

The storage device 100 according to some example embodiments may include a controller 110 and a plurality of memory chips 120.

The plurality of memory chips 120 may be, for example, a NAND flash memory, a vertical NAND flash memory, a NOR flash memory, a resistive RAM (RRAM), a phase-change memory (PRAM), a magnetoresistive memory (MRAM), a ferroelectric memory (FRAM), and a spin injection magnetization reversal memory (STT-RAM), but the example embodiments are not limited thereto.

Each of the plurality of memory chips 120 may include an address setting circuit 122 and a memory cell region 124. The memory cell region 124 may be a region in which data is stored. The memory cell region 124 may be used in a sense of including a buffer memory region. The address setting circuit 122 may be a circuit which sets the addresses of each of the plurality of memory chips 120. A specific description of the address setting circuit 122 will be provided later. As used herein, the term "address" refers to the chip addresses of the respective memory chips 120, and is not used to refer to the addresses of the respective memory cell regions 124 in the memory chips 120.

The controller 110 may include an address setting command circuit 112 and a chip select circuit 114. According to some example embodiments, the address setting command circuit 112 may provide an address setting command (CMD of FIG. 3) to each of the plurality of memory chips 120. For example, when the controller 110 detects power supplied to the storage device 100, the controller 110 may provide the address setting command (CMD of FIG. 3) to each address setting circuit 122 of the plurality of memory chips 120 through the address setting command circuit 112. In another example, when the controller 110 receives a specific command from the host 200, the controller 110 may provide the address setting command (CMD of FIG. 3) to each of the plurality of memory chips 120 through the address setting command circuit 112. However, the example embodiments are not limited thereto, and a person having ordinary knowledge in the technical field of the present inventive concepts may determine various situations in which the address setting command (CMD of FIG. 3) is provided to the address setting circuit 122.

According to some example embodiments, as discussed in more detail below with reference to FIG. 2, the chip select circuit 114 may select the appropriate memory chip 120. For example, the chip select circuit 114 may enable a memory chip including an address designated from the host 200, and may disable the remaining memory chips.

Figure 2:
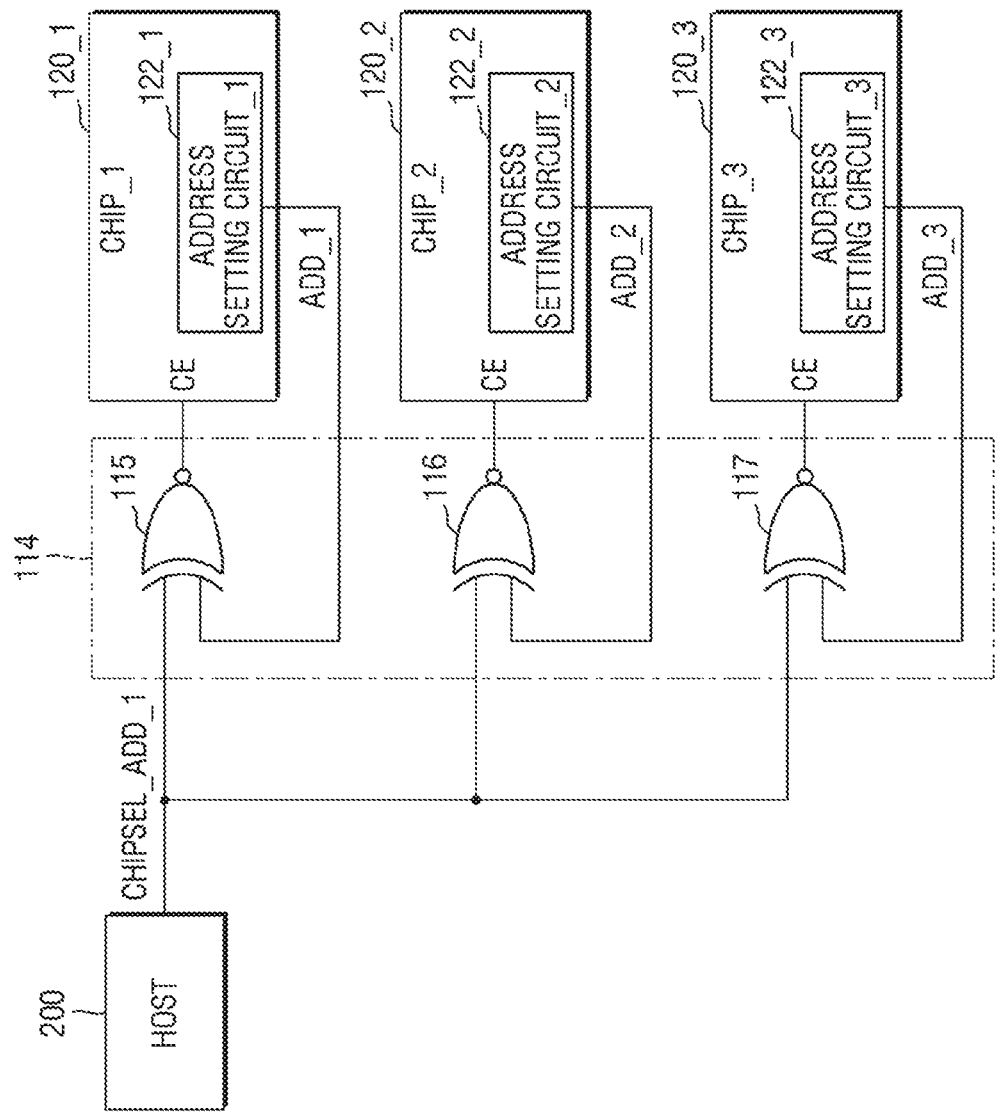
FIG. 2 is an example diagram for explaining a chip select circuit according to some example embodiments.

FIG. 2 is an example diagram for explaining a chip select circuit according to some example embodiments. For the sake of convenience of explanation, the following explanation will be made assuming that the storage device 100 includes a first memory chip 120_1 to a third memory chip 120_3, but the example embodiments are not limited to the number of the memory chips. For example, the storage device 100 may include memory chips more or fewer than the memory chips illustrated in some drawings. Further, in the following description, for the sake of convenience of explanation, the address setting circuit 122 of the memory chip 120 is mainly illustrated, and the memory cell region 124 and the like are omitted.

Referring to FIG. 2, the process of selecting one of the three memory chips 120_1, 120_2, and 120_3 by the chip select circuit 114 will be described. Hereinafter, in order to distinguish each of the plurality of memory chips 120, the first memory chip 120_1 to the third memory chip 120_3 and the like will be separately explained. The underbar "_" illustrated in each drawing is for distinguishing each memory chip and its associated constituent elements. For example, reference numerals associated with the first memory chip 120_1 are denoted by "xxx_1", and the reference numerals associated with the second memory chip 120_2 are denoted by "xxx_2". Similarly, the reference numerals associated with the third memory chip 120_3 are denoted by "xxx_3". This is for convenience of explanation, and the example embodiments are not limited to these divisions.

According to some example embodiments, the chip select circuit 114 may include a first comparator 115, a second comparator 116, and a third comparator 117. For example, the first comparator 115 to the third comparator 117 may be XNOR gates, but the example embodiments are not limited thereto. The first memory chip 120_1 to the third memory chip 120_3 may include a first address setting circuit 122_1 to a third address setting circuit 122_3, respectively, and each of the first memory chip 120_1 to the third memory chip 120_3 may include a chip enable terminal CE.

When the chip enable terminal CE receives an enable signal (e.g., a logic high level), each memory chip may be enabled. Also, when the chip enable terminal CE receives a disable signal (e.g., a logic low level), each memory chip may be disabled. For example, when the chip enable terminal CE of the first memory chip 120_1 receives an enable signal, the first memory chip 120_1 may be enabled. Also, when the chip enable terminal CE of the first memory chip 120_1 receives the disable signal, the first memory chip 120_1 may be disabled.

The first address setting circuit 122_1 outputs a first address ADD_1, the second address setting circuit 122_2 outputs a second address ADD_2, and the third address setting circuit 122_3 may output a third address ADD_3. When the first address setting circuit 122_1 to the third address setting circuit 122_3 normally operate, the first address ADD_1 to the third address ADD_3 may be distinguished from each other.

According to some example embodiments, in order to control the first memory chip 120_1, the host 200 may transmit the first memory chip selection command CHIPSEL_ADD_1 to the controller 110. The chip select circuit 114 compares the first address ADD_1 included in the first memory chip selection command CHIPSEL_ADD_1 with each of the addresses which are output from the first address setting circuit 122_1 to the third address setting circuit 122_3 to enable only a specific memory chip, and may disable the remaining chips. For example, the first comparator 115 compares the first address included in the first memory chip selection command CHIPSEL_ADD_1 with the address output of the first address setting circuit 122_1, and may provide the enable signal (e.g., a logic high level) to the chip enable terminal CE of the first memory chip 120_1. Further, the second comparator 116 compares the first address ADD_1 included in the first memory chip selection command CHIPSEL_ADD_1 with the address output of the second address setting circuit 122_2, and may provide the disable signal (e.g., a logic low level) to the chip enable terminal CE of the second memory chip 120_2. Similarly, the third comparator 117 compares the first address ADD_1 included in the first memory chip selection command CHIPSEL_ADD_1 with the address output of the third address setting circuit 122_3, and may provide a disable signal (e.g., a logic low level) to the chip enable terminal CE of the third memory chip 120_3. At this time, the first memory chip 120_1 is enabled and the second memory chip 120_2 and the third memory chip 120_3 may be disabled. For example, the first memory chip selection command CHIPSEL_ADD_1 may be included in a read command or a program command. In another example, the first memory chip selection command CHIPSEL_ADD_1 may be another command that precedes the read command or the program command.

Figure 3:
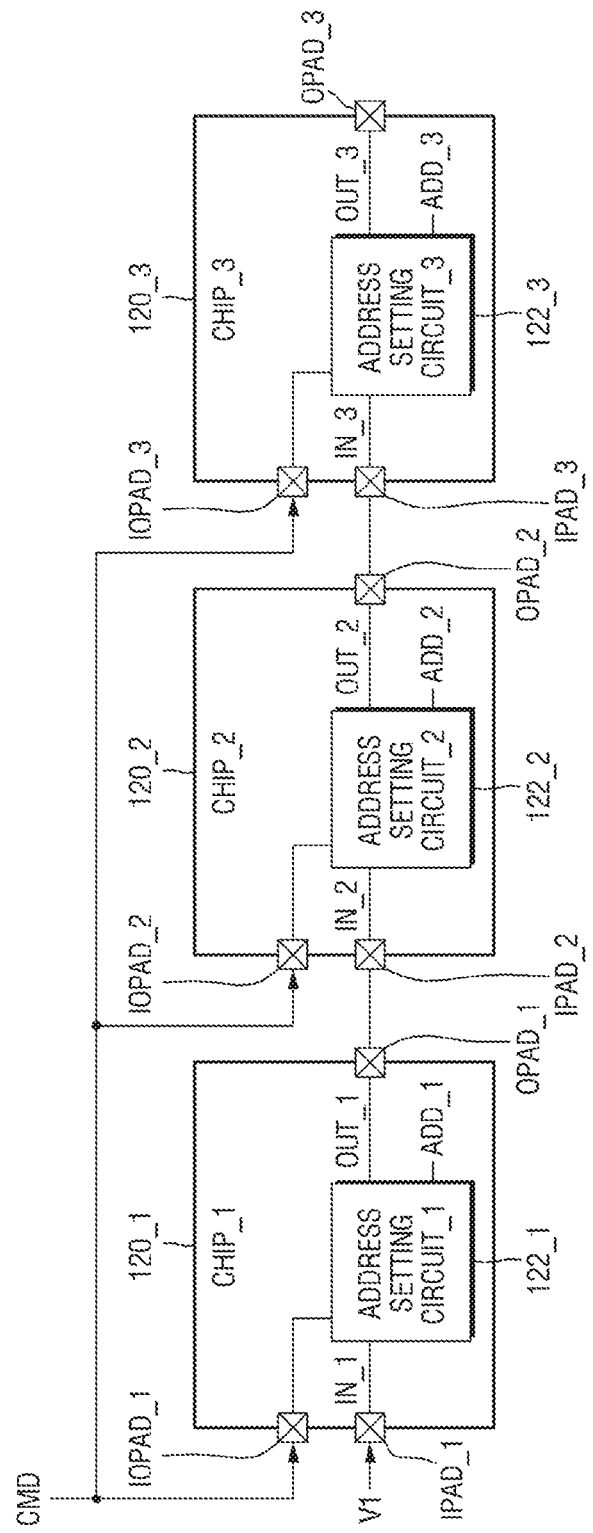
FIG. 3 is an example diagram for explaining a connection relation between a plurality of memory chips according to some example embodiments.

FIG. 3 is an example diagram for explaining a connection relation between a plurality of memory chips according to some example embodiments.

Referring to FIGS. 1 and 3, the first memory chip 120_1 may include a first I/O pad IOPAD_1, a first input pad IPAD_1, a first output pad OPAD_1, and a first address setting circuit 122_1.

The first I/O pad IOPAD_1 may provide data and commands, which are received from the controller 110, to the first memory chip 120_1, or may provide data, which is received from the first memory chip 120_1, to the controller 110.

For example, the first I/O pad IOPAD_1 may be implemented as eight fins to be able to receive the provision of information of 8 bits, but the example embodiments are not limited thereto. The command received from the controller 110 may include an address setting command CMD. The address setting command CMD may be provided to the first address setting circuit 122_1 through the first I/O pad IOPAD_1.

The first input pad IPAD_1 may receive a first signal V1 from the outside. The first input pad IPAD_1 may provide the received first signal V1 to the first address setting circuit 122_1 as a first input signal IN_1. The first address setting circuit 122_1 may output the first output signal OUT_1 and the first address ADD_1. The first output signal OUT_1 may be provided to the first output pad OPAD_1.

The second memory chip 120_2 may include a second I/O pad IOPAD_2, a second input pad IPAD_2, a second output pad OPAD_2, and a second address setting circuit 122_2. Since the second I/O pad IOPAD_2 and the second address setting circuit 122_2 are similar to the first I/O pad IOPAD_1 and the first address setting circuit 122_1, description thereof will not be provided.

The second input pad IPAD_2 may be connected to the first output pad OPAD_1 of the first memory chip 120_1. In other words, the second input pad IPAD_2 may receive provision of the first output signal OUT_1. The second input pad IPAD_2 may provide the received first output signal OUT_1 to the second address setting circuit 122_2 as a second input signal IN_2. In other words, the second input signal IN_2 may be substantially the same as the first output signal OUT_1. The second address setting circuit 122_2 may output the second output signal OUT_2 and the second address ADD_2. The second output signal OUT_2 may be provided to the second output pad OPAD_2.

The third memory chip 120_3 may include a third I/O pad IOPAD_3, a third input pad IPAD_3, a third output pad OPAD_3, and a third address setting circuit 122_3. Since the third I/O pad IOPAD_3 and the third address setting circuit 122_3 are similar to the first I/O pad IOPAD_1 and the first address setting circuit 122_1, respectively, description thereof will not be provided.

The third input pad IPAD_3 may be connected to the second output pad OPAD_2 of the second memory chip 120_2. In other words, the third input pad IPAD_3 may receive provision of the second output signal OUT_2. The third input pad IPAD_3 may provide the received second output signal OUT_2 to the third address setting circuit 122_3 as a third input signal IN_3. In other words, the third input signal IN_3 may be substantially the same as the second output signal OUT_2. The third address setting circuit 122_3 may output the third output signal OUT_3 and the third address ADD_3. The third output signal OUT_3 may be provided to the third output pad OPAD_3. That is, the first output pad OPAD_1 of the first memory chip 120_1 is connected to the second input pad IPAD_2 of the second memory chip 120_2, and the second output pad OPAD_2 of the second memory chip 120_2 may be connected to the third input pad IPAD_3 of the third memory chip 120_3. In other words, the first memory chip 120_1 to the third memory chip 120_3 may be connected in a daisy chain manner. The address setting circuit 122 will be specifically described referring to FIGS. 4 and 5.

Figure 4:
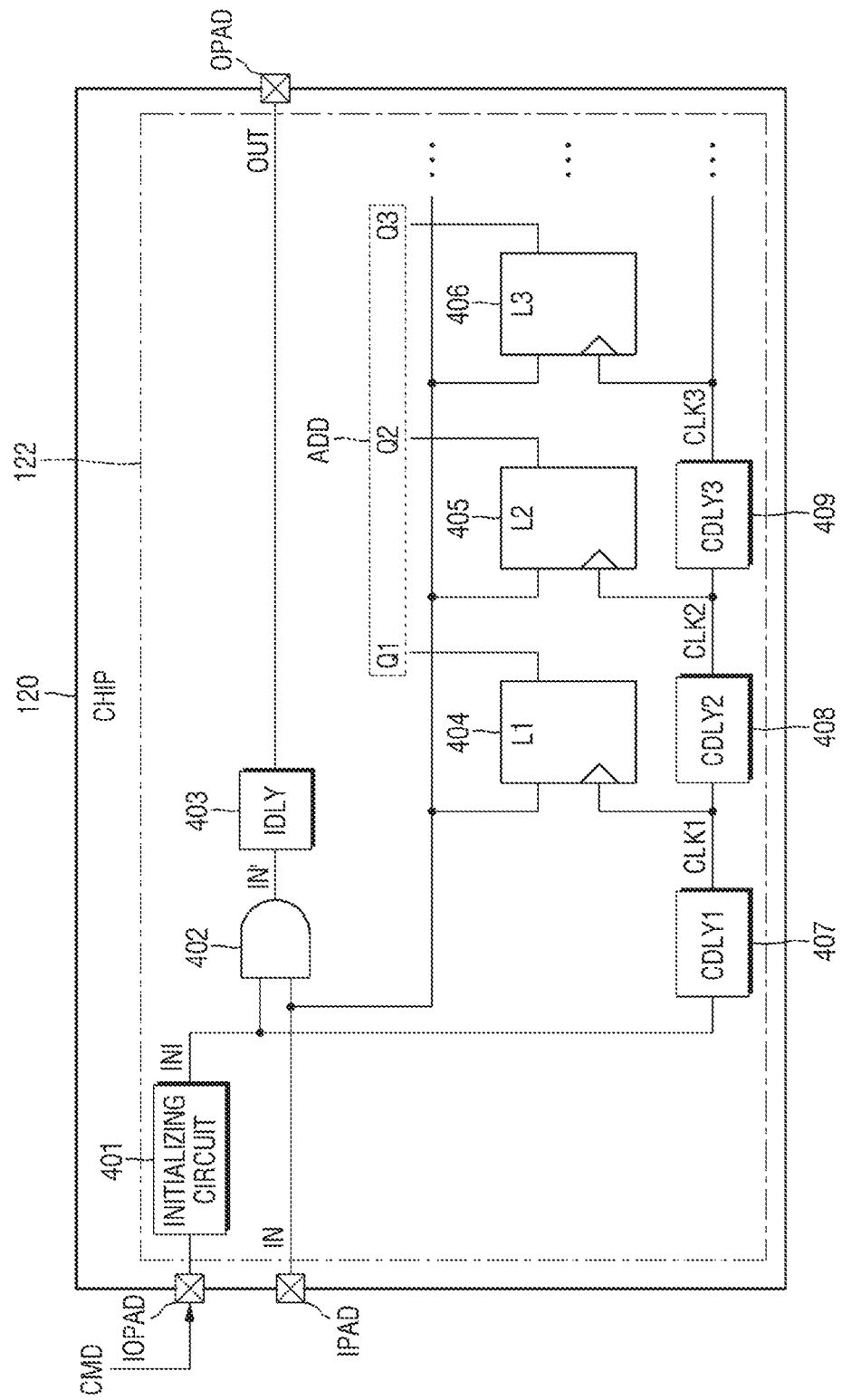
FIG. 4 is an example diagram for describing the address setting circuit according to some example embodiments.

FIG. 4 is an example diagram for describing the address setting circuit according to some example embodiments. The configuration of the address setting circuit 122 illustrated in FIG. 4 may be similarly applied to all of the first address setting circuit 122_1 to the third address setting circuit 122_3.

Referring to FIGS. 3 and 4, the address setting circuit 122 may include an initializing circuit 401, a first AND gate 402, an input delay circuit 403, a first latch 404, a second latch 405, a third latch 406, a first clock delay circuit 407, a second clock delay circuit 408, and a third clock delay circuit 409. The number of latches included in the address setting circuit 122 according to some example embodiments and the number of clock delay circuits may be adjusted depending on the number of memory chips 120 included in the storage device (100 of FIG. 1).

The initializing circuit 401 may receive the address setting command CMD through the I/O pad IOPAD. When the address setting command CMD is received by the initializing circuit 401, the initializing circuit 401 may generate an initializing signal INI. At this time, the initializing signal INI may be provided to the first AND gate 402 and the first clock delay circuit 407.

The input signal IN may be provided to the first AND gate 402 and the first latch 404 to the third latch 406. As described above, the input signal IN may be a signal received from the outside through the input pad IPAD. For example, the first input signal IN_1 of the first memory chip 120_1 may be a first signal V1 provided from the outside. The first signal V1 may be a DC signal having a specific voltage level or a ground signal. Hereinafter, the description will be made on the assumption that the first signal V1 is a DC signal having a logic high level. According to some example embodiments, the second input signal IN_2 of the second memory chip 120_2 may be substantially the same as the first output signal IN_2 provided from the first output pad OPAD_1 of the first memory chip OUT_1. Further, the third input signal IN_3 of the third memory chip 120_3 may be substantially the same as the second output signal OUT_2 provided from the second output pad OPAD_2 of the second memory chip 120_2.

The first AND gate 402 may perform AND gating of the initializing signal INI and the input signal IN to output an initialized input signal IN'. The initialized input signal IN' may be provided to the input delay circuit 403. In other words, the initialized input signal IN' may be provided to the input delay circuit 403 based on the initializing signal INI.

The input delay circuit 403 may delay the initialized input signal IN'. The input delay circuit 403 may provide the delayed initialized input signal IN' to the output pad OPAD as the output signal OUT.

The first clock delay circuit 407 may delay the initializing signal INI to generate a first clock signal CLK1. The first clock signal CLK1 may be provided to the first latch 404 and the second clock delay circuit 408. The second clock delay circuit 408 may delay the first clock signal CLK1 to generate a second clock signal CLK2. The second clock signal CLK2 may be provided to the second latch 405 and the third clock delay circuit 409. The third clock delay circuit 409 may delay the second clock signal CLK2 to generate a third clock signal CLK3. The third clock signal CLK3 may be provided to the third latch 406.

The first latch 404 may store the input signal IN based on the first clock signal CLK1. In other words, the first latch 404 may store the level of the input signal IN at the time point when the level of the first clock signal CLK1 changes (rises or falls). The level of the input signal IN stored in the first latch 404 may be provided as an output Q1 of the first latch. The second latch 405 may store the input signal IN based on the second clock signal CLK2. In other words, the second latch 405 may store the level of the input signal IN at the time when the level of the second clock signal CLK2 changes (rises or falls). The level of the input signal IN stored in the second latch 405 may be provided as an output Q2 of the second latch. The third latch 406 may store the input signal IN based on the third clock signal CLK3. In other words, the third latch 406 may store the level of the input signal IN at the time when the level of the third clock signal CLK3 changes (rises or falls). The level of the input signal IN stored in the third latch 406 may be provided as an output Q3 of the third latch.

The combination of the output Q1 of the first latch, the output Q2 of the second latch, and the output Q3 of the third latch may be the address ADD of the memory chip 120. In other words, the address setting circuit 122 may output the combination of the output Q1 of the first latch, the output Q2 of the second latch and the output Q3 of the third latch as the address ADD of the memory chip. The specific operation of the first address setting circuit 122_1 of the first memory chip 120_1 to the third address setting circuit 122_3 of the third memory chip 120_3 will be described referring to the timing chart of FIG. 5.

Figure 5:
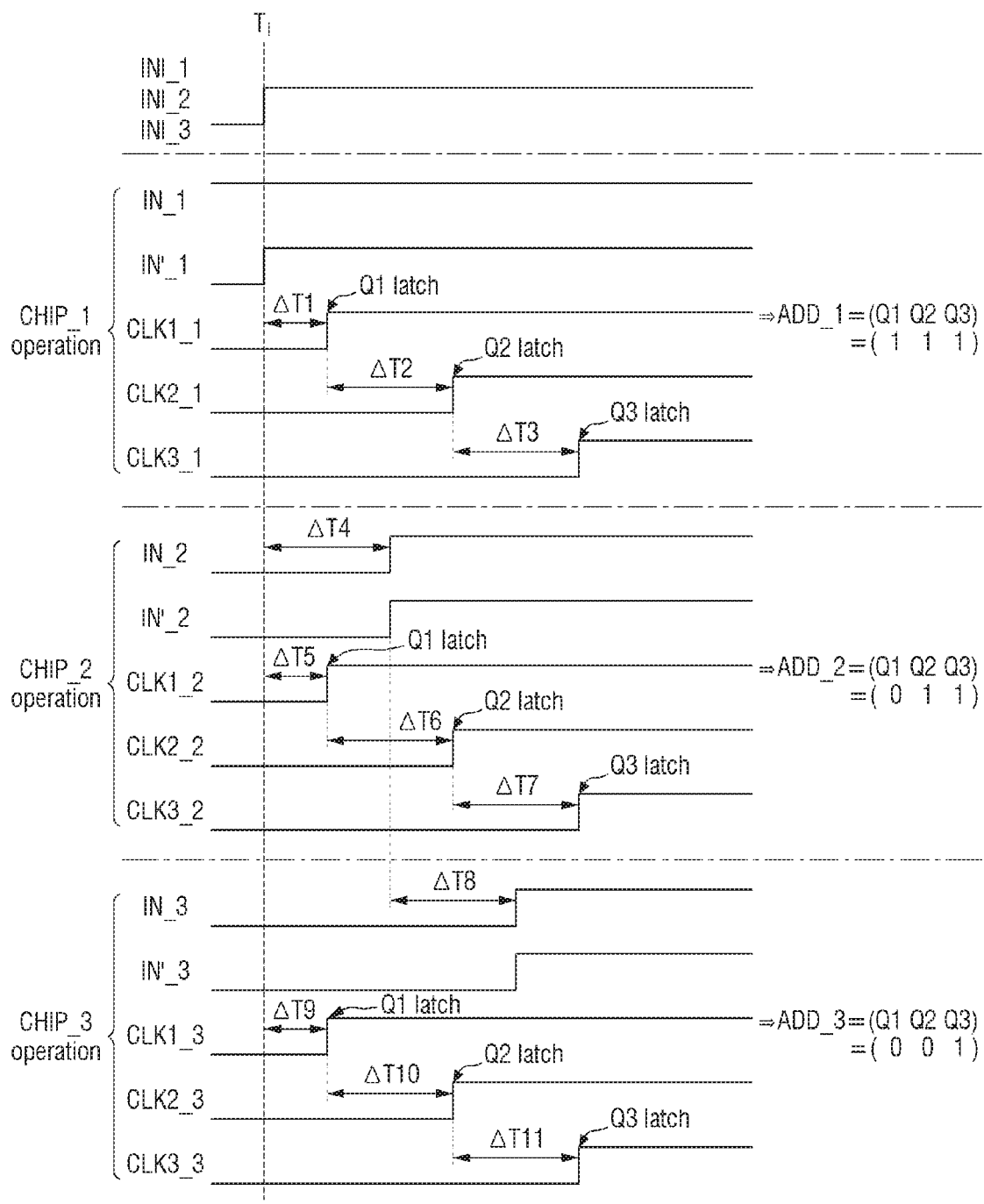
FIG. 5 is an example timing diagram for explaining the operation of an address setting circuit according to some example embodiments.

FIG. 5 is an example timing diagram for explaining the operation of an address setting circuit according to some example embodiments. For convenience of explanation, the initializing signal INI, the initialized input signal IN', the first clock signal CLK1, the second clock signal CLK2 and the third clock signal CLK3 of the first address setting circuit 122_1 are named as a first initializing signal INI_1, a first initialized input signal IN'_1, a first_1 clock signal CLK1_1, a second_1 clock signal CLKa_1, and a third_1 clock signal CLK3_1, respectively. Further, the initializing signal INI, the initialized input signal IN', the first clock signal CLK1, the second clock signal CLK2 and the third clock signal CLK3 of the second address setting circuit 122_2 are named as a second initializing signal INI_2, a second initialized input signal IN'_2, a first_2 clock signal CLK1_2, a second_2 clock signal CLK2_2, and a third_2 clock signal CLK3_2, respectively. Similarly, the initializing signal INI, the initialized input signal IN', the first clock signal CLK1, the second clock signal CLK2 and the third clock signal CLK3 of the third address setting circuit 122_3 are named as a third initializing signal INI_3, a third initialized input signal IN'_3, a first_3 clock signal CLK1_3, a second_3 clock signal CLK2_3, and a third_3 clock signal CLK3_3, respectively.

Referring to FIGS. 3 to 5, since the address setting command CMD is provided to the first I/O pad IOPAD_1, the second I/O pad IOPAD_2 and the third I/O pad IOPAD_3 at substantially the same time, the first initializing signal INI_1, the second initializing signal INI_2, and the third initializing signal INI_3 are all generated at a first time point $T_i$. In other words, the first initializing signal INI_1, the second initializing signal INI_2 and the third initializing signal INI_3 may be generated at substantially the same time at the first time point $T_i$. Here, the term "substantially" includes a PVT variation between each element or circuit. For example, although there may be a minute difference between the time point at which the initializing circuit 401 of the first address setting circuit 122_1 generates the first initializing signal INI_1 and the time point at which the initializing circuit 401 of the second address setting circuit 122_2 generates the second initializing signal INI_2 due to the PVT variation, this is regarded as being "substantially the same" in this specification. Also, although the levels of the first initializing signal INI_1, the second initializing signal INI_2, and the third initializing signal INI_3 are illustrated as changing from the logic low level to the logic high level on the first time point $T_i$, the example embodiments are not limited thereto. For example, the levels of the first initializing signal INI_1, the second initializing signal INI_2, and the third initializing signal INI_3 may change from the logic high level to the logic low level based on the first time point $T_i$. In this case, those having ordinary skill in the technical field of the present inventive concepts may appropriately change the circuit to implement some example embodiments of the present inventive concepts.

The first input signal IN_1 may be a first signal V1 that is input from the outside. In some example embodiments, the first signal V1 is illustrated as being a logic high level, but the example embodiments are not limited thereto. For example, the first signal V1 may be a logic low level (e.g., a ground level), and in this case, one having ordinary skill in the technical field of the present inventive concepts may appropriately change the circuit to implement some example embodiments of the present inventive concepts. Assuming that the delay of the first AND gate 402 of the first address setting circuit 122_1 is ignored, the level of the first initialized input signal IN'_1 may change from the logic low level to the logic high level based on the first time point $T_i$.

The first_1 clock signal CLK1_1 may be signal obtained by delaying the first initializing signal INI_1 by a first time ΔT1. According to some example embodiments, the first clock delay circuit 407 of the first address setting circuit 122_1 may delay the first initializing signal INI_1 by the first time ΔT1. In other words, the first clock delay circuit 407 of the first address setting circuit 122_1 may generate the first initializing signal INI_1 delayed by the first time ΔT1 as the first_1 clock signal CLK1_1. The second_1 clock signal CLK2_1 may be signal obtained by delaying the first_1 clock signal CLK1_1 by the second time ΔT2. According to some example embodiments, the second clock delay circuit 408 of the first address setting circuit 122_1 may delay the first_1 clock signal CLK1_1 by the second time ΔT2. In other words, the second clock delay circuit 408 of the first address setting circuit 122_1 may generate the first_1 clock signal CLK1_1 delayed by the second time ΔT2 as a second_1 clock signal CLK2_1. The third_1 clock signal CLK3_1 may be a signal obtained by delaying the second_1 clock signal CLK2_1 by the third time ΔT3. According to some example embodiments, the third clock delay circuit 409 of the first address setting circuit 122_1 may delay the second_1 clock signal CLK2_1 by the third time ΔT3. In other words, the third clock delay circuit 409 of the first address setting circuit 122_1 may generate the second second_1 clock signal CLK2_1 delayed by the third time ΔT3 as a third_1 clock signal CLK3_1. According to some example embodiments, the second time ΔT2 and the third time ΔT3 may be substantially the same. Also, the first time ΔT1 may be smaller than the second time ΔT2 and the third time ΔT3. For example, the first time ΔT1 may be a half of the second time ΔT2, but the example embodiments are not limited thereto.

The first latch 404, the second latch 405, and the third latch 406 of the first address setting circuit 122_1 may store the levels of the first input signal IN_1 at the time point when the levels of the first_1 clock signal CLK1_1, the second_1 clock signal CLK2_1, and the third_1 clock signal CLK3_1 change, respectively. Therefore, the output Q1 of the first latch, the output Q2 of the second latch, and the output Q3 of the third latch of the first address setting circuit 122_1 may be 1 (a logic high level), 1 (a logic high level), and 1 (a logic low level), respectively. As described above, the output Q1 of the first latch, the output Q2 of the second latch, and the output Q3 of the third latch may be the address ADD of the memory chip 120. Therefore, the first address ADD_1 of the first memory chip 120_1 may be (1 1 1).

According to some example embodiments, the input delay circuit 403 of the first address setting circuit 122_1 may delay the first initialized input signal IN'_1 by the fourth time ΔT4. The input delay circuit 403 of the first address setting circuit 122_1 may provide the first initialized input signal IN'_1 delayed by the fourth time ΔT4 to the first output pad OPAD_1. The signal provided to the first output pad OPAD_1 may be provided to the second input pad IPAD_2 connected therewith. Therefore, the second input signal IN_2 may be substantially the same as the first initialized input signal IN'_1 delayed by the fourth time ΔT4. Assuming that the delay of the first AND gate 402 of the second address setting circuit 122_2 is ignored, the second input signal IN_2 may be substantially the same as the second initialized input signal IN'_2. In other words, the second input signal IN_2 and the second initialized input signal IN'_2 may be substantially the same as the first initialized input signal IN'_1 delayed by the fourth time ΔT4.

Similarly, the first_2 clock signal CLK1_2 may be a signal obtained by delaying the second initializing signal INI_2 by a fifth time ΔT5. Also, the second_2 clock signal CLK2_2 may be a signal obtained by delaying the first_2 clock signal CLK1_2 by a sixth time ΔT6. Also, the third_2 clock signal CLK3_2 may be a signal obtained by delaying the second_2 clock signal CLK2_2 by a seventh time ΔT7. Also, the third input signal IN_3 and the third initialized input signal IN'_3 may be substantially the same as the second initialized input signal IN'_2 delayed by an eighth ΔT8. Also, the first_3 clock signal CLK1_3 may be a signal obtained by delaying the third initializing signal INI_3 by a ninth time ΔT9. Further, the second_3 clock signal CLK2_3 may be a signal obtained by delaying the first_3 clock signal CLK1_3 by a tenth time ΔT10. Also, the third_3 clock signal CLK3_3 may be a signal obtained by delaying the second_3 clock signal CLK2_3 by an eleventh time ΔT11.

According to some example embodiments, the first time ΔT1, the fifth time ΔT5, and the ninth time ΔT9 may be substantially identical to each other. Also, the second time ΔT2, the sixth time ΔT6, and the tenth time ΔT10 may be substantially identical to each other. Also, the third time ΔT3, the seventh time ΔT7, and the eleventh time ΔT11 may be substantially identical to each other. Also, the fourth time ΔT4 and the eighth time ΔT8 may be substantially identical to each other.

According to some example embodiments, the second time ΔT2 to the fourth time ΔT4, the sixth time ΔT6 to the eighth time ΔT8, and the tenth time ΔT10 to the eleventh time ΔT11 may be substantially identical to each other. In other words, the delay time of the input delay circuit 403, and the delay times of the second clock delay circuit 408 and the third clock delay circuit 409 may be substantially identical to each other. Further, the first time ΔT1, the fifth time ΔT5, and the ninth time ΔT9 may be smaller than the second time ΔT2 to the fourth time ΔT4, the sixth time ΔT to the eight time ΔT8, and the tenth time ΔT10 to the eleventh time ΔT11.

According to some example embodiments, the first latch 404, the second latch 405, and the third latch 406 of the second address setting circuit 122_2 may store the level of the second input signal IN_2 (that is, the first initialized input signal IN'_1 delayed by the fourth time ΔT4) delayed by the second input signal (IN_2) at the time point when the levels of the first_2 clock signal CLK1_2, the second_2 clock signal CLK2_2, and the third_2 clock signal CLK3_2 change. Therefore, the output Q1 of the first latch, the output Q2 of the second latch, and the output Q3 of the third latch of the second address setting circuit 122_2 may be 0 (a logic low level), 1 (a logic high level), and 1 (a logic high level). Therefore, the second address ADD_2 of the second memory chip 120_2 may be (0 1 1). According to some example embodiments, the first latch 404, the second latch 405, and the third latch 406 of the third address setting circuit 122_3 may store the level of the third input signal IN_3 (that is, the second initialized input signal IN'_2 delayed by the eight time ΔT8) at the time point when the levels of the first_3 clock signal CLK1_3, the second_3 clock signal CLK2_3, and the third_3 clock signal CLK3_3 change, respectively. Therefore, the output Q1 of the first latch, the output Q2 of the second latch, and the output Q3 of the third latch of the third address setting circuit 122_3 may be 0 (a logic low level), 1 (a logic low level), and 1 (a logic high level), respectively. Therefore, the third address ADD_3 of the third memory chip 120_3 may be (0 0 1).

Figure 6:
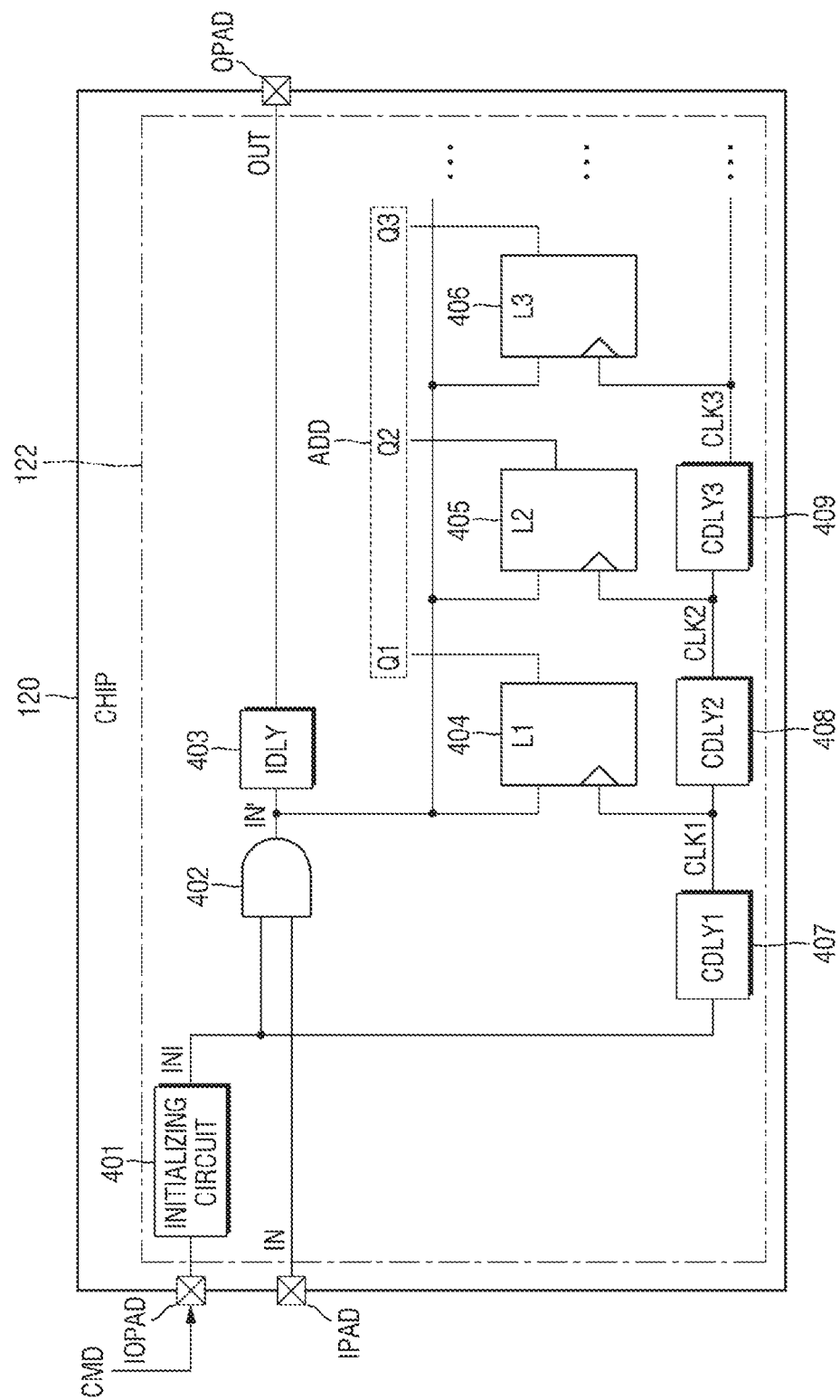
FIG. 6 is an example diagram illustrating an address setting circuit according to some example embodiments.

FIG. 6 is an example diagram illustrating an address setting circuit according to some example embodiments. The configuration of the address setting circuit 122 illustrated in FIG. 6 may be similarly applied to all the first address setting circuit 122_1 to the third address setting circuit 122_3. For convenience of explanation, repeated contents of contents described above will be omitted or briefly explained.

Referring to FIG. 6, the input signal IN may be provided to the first AND gate 402. The first AND gate 402 may perform AND gating of the initializing signal INI and the input signal IN to output the initialized input signal IN'. The initialized input signal IN' may be provided to the input delay circuit 403, the first latch 404, the second latch 405, and the third latch 406.

The first latch 404 may store the initialized input signal IN' based on the first clock signal CLK1. In other words, the first latch 404 may store the level of the initialized input signal IN' at the time when the level of the first clock signal CLK1 changes (rises or falls). The second latch 405 may store the initialized input signal IN' based on the second clock signal CLK2. In other words, the second latch 405 may store the level of the initialized input signal IN' at the time point when the level of the second clock signal CLK2 changes (rises or falls). The third latch 406 may store the initialized input signal IN' based on the third clock signal CLK3. In other words, the third latch 406 may store the level of the initialized input signal IN' at the time point when the level of the third clock signal CLK3 changes (rises or falls). The operation of the address setting circuit 122 according to FIG. 6 may be similar to the timing diagram illustrated in FIG. 5.

Figure 7:
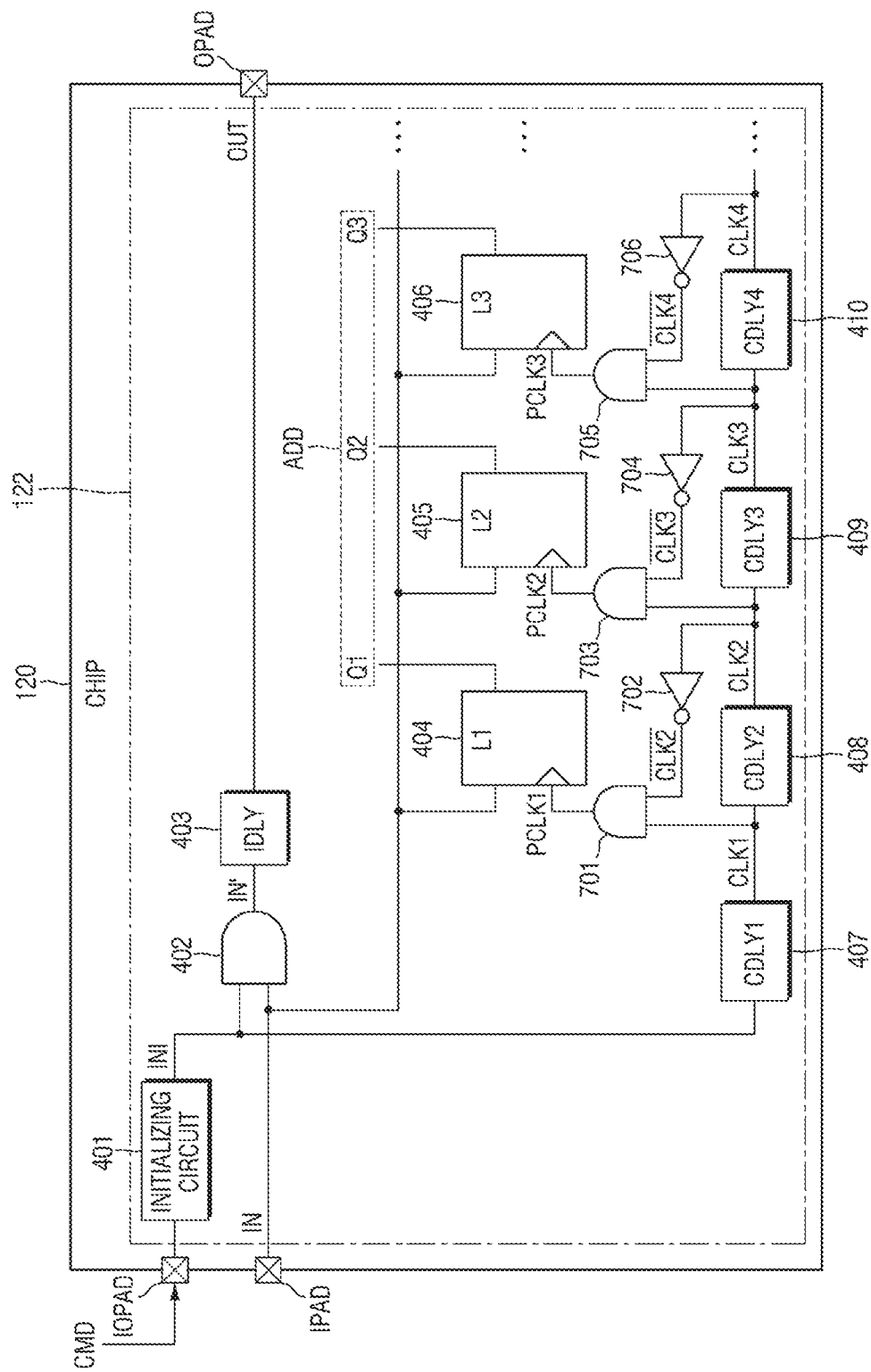
FIG. 7 is an example diagram for describing an address setting circuit according to some example embodiments.

FIG. 7 is an example diagram for describing an address setting circuit according to some example embodiments. The configuration of the address setting circuit 122 illustrated in FIG. 7 may be similarly applied to all the first address setting circuit 122_1 to the third address setting circuit 122_3. For convenience of explanation, repeated contents of contents described above will be omitted or briefly explained.

Referring to FIG. 7, the address setting circuit 122 according to some example embodiments may include an initializing circuit 401, a first AND gate 402, a second AND gate 701, a third AND gate 703, a fourth AND gate 705, an input delay circuit 403, a first latch 404, a second latch 405, a third latch 406, a first clock delay circuit 407, a second clock delay circuit 408, a third clock delay circuit 409, a fourth clock delay circuit 410, a first inverter 702, a second inverter 704, and a third inverter 706.

The first clock delay circuit 407 may generate the first clock signal CLK1 by delaying the initializing signal INI. The second clock delay circuit 408 may generate the second clock signal CLK2 by delaying the first clock signal CLK1. The third clock delay circuit 409 may generate the third clock signal CLK3 by delaying the second clock signal CLK2. The fourth clock delay circuit 410 may generate the fourth clock signal CLK4 by delaying the third clock signal CLK3.

The first inverter 702 may invert the second clock signal CLK2 to generate an inverted signal $\overline{CLK2}$ of the second clock signal. The second inverter 704 may invert the third clock signal CLK3 to generate an inverted signal $\overline{CLK3}$ of the third clock signal. The third inverter 706 may invert the fourth clock signal CLK4 to generate an inverted signal $\overline{CLK4}$ of the fourth clock signal.

The second AND gate 701 may perform AND gating of the first clock signal CLK1 and the inverted signal $\overline{CLK2}$ of the second clock signal to generate a first pulse clock signal PCLK1. The third AND gate 703 may perform AND gating of the second clock signal CLK2 and the inverted signal $\overline{CLK3}$ of the third clock signal to generate a second pulse clock signal PCLK2. The fourth AND gate 705 may perform AND gating of the third clock signal CLK3 and the inverted signal $\overline{CLK4}$ of the fourth clock signal to generate a third pulse clock signal PCLK3. The first pulse clock signal PCLK1 to the third pulse clock signal PCLK3 may be provided to the first latch 404 to the third latch 406, respectively.

Figure 8:
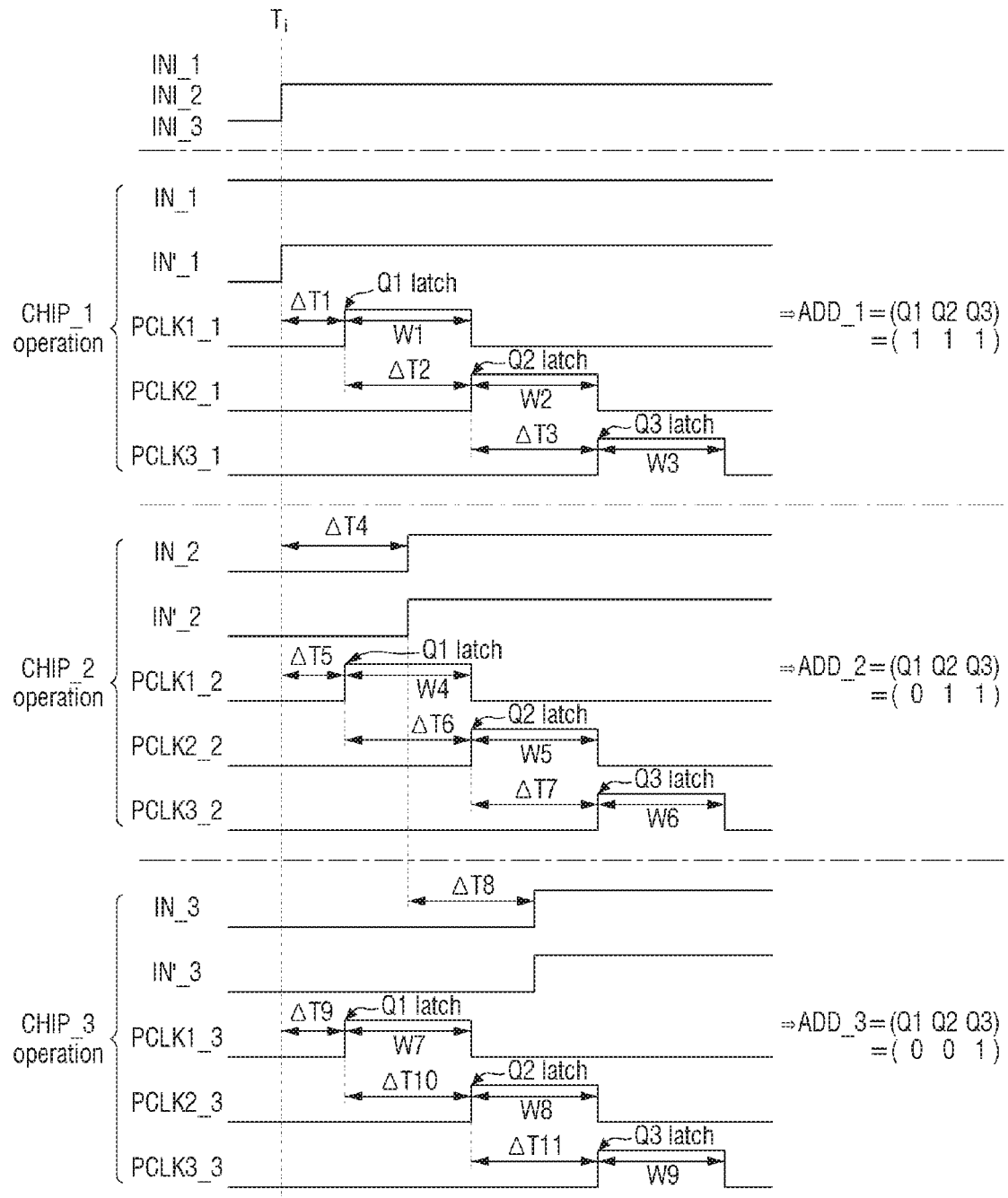
FIG. 8 is an example timing diagram for explaining the operation of the address setting circuit according to some example embodiments.

FIG. 8 is an example timing diagram for explaining the operation of the address setting circuit according to some example embodiments. For convenience of explanation, the first pulse clock signal PCLK1, the second pulse clock signal PCLK2, and the third pulse clock signal PCLK3 of the first address setting circuit 122_1 are defined as a first_1 pulse clock signal PCLK1_1, a second_1 pulse clock signal PCLK2_1, and a third_1 pulse clock signal PCLK3_1, respectively. Further, the first pulse clock signal PCLK1, the second pulse clock signal PCLK2, and the third pulse clock signal PCLK3 of the second address setting circuit 122_2 are defined as a first_2 pulse clock signal PCLK1_2, a second_2 pulse clock signal PCLK2_2, and a third_2 pulse clock signal PCLK3_2, respectively. Similarly, the first pulse clock signal PCLK1, the second pulse clock signal PCLK2, and the third pulse clock signal PCLK3 of the third address setting circuit 122_3 are defined as a first_3 pulse clock signals PCLK1_3, a second_3 pulse clock signal PCLK2_3, and a third_3 pulse clock signal PCLK3_3, respectively. For convenience of explanation, repeated contents of contents described above will be omitted or briefly explained.

The pulse widths of the first_1 pulse clock signal PCLK1_1 to the third_3 pulse clock signal PCLK3_3 may be a first width W1 to a ninth width W9, respectively. According to some example embodiments, the first width W1 may be substantially the same as the delay time (e.g., the second time ΔT2) of the second clock delay circuit 408 of the first address setting circuit 122_1. In other words, the time point at which the level of the first_1 pulse clock signal PCLK1_1 falls may be substantially the same as the time point at which the level of the second_1 pulse clock signal PCLK2_1 rises. Similarly, the time point at which the level of the second_1 pulse clock signal PCLK2_1 falls may be substantially the same as the time point at which the level of the third_1 pulse clock signal PCLK3_1 rises. Similarly, the time point at which the level of the first_2 pulse clock signal PCLK1_2 falls may be substantially the same as the time point at which the level of the second_2 pulse clock signal PCLK2_2 rises. Similarly, the time point at which the level of the second_2 pulse clock signal PCLK2_2 falls may be substantially the same as the time point at which the level of the third_2 pulse clock signal PCLK3_2 rises. Further, the time point at which the level of the first_3 pulse clock signal PCLK1_3 falls may be substantially the same as the time point at which the level of the second_3 pulse clock signal PCLK2_3 rises, and the time point at which the second_3 pulse clock signal PCLK2_3 falls may be substantially the same as the time point at which the level of the third_3 pulse clock signal PCLK3_3 rises. That is, the first width W1 to the ninth width W9 may be substantially the same as the delay times of the second clock delay circuit 408 to the fourth clock delay circuit 410 of each address setting circuit 122.

Each of the latches included in the first address setting circuit 122_1 to the third address setting circuit 122_3 may store the level of the input signal IN at the time point when the levels of the first_1 pulse clock signal PCLK1_1, the second_1 pulse clock signal PCLK2_1, the third_1 pulse clock signal PCLK3_1, the first_2 pulse clock signal PCLK1_2, the second_2 pulse clock signal PCLK2_2, the third_2 pulse clock signal PCLK3_2, the first_3 pulse clock signal PCLK1_3, the second_3 pulse clock signal PCLK2_3 and the third_3 clock signal PCLK3_3 change from the logic low level to the logic high level.

Although it is not illustrated, the address setting circuit 122 according to some example embodiments may store the level of the initialized input signal IN' at the time point when the levels of the initial pulse clock signal PCLK1 to the third pulse clock signal PCLK3 change. Those having ordinary skill in the technical field of the present inventive concepts may change the circuit configuration in various ways.

Figure 9:
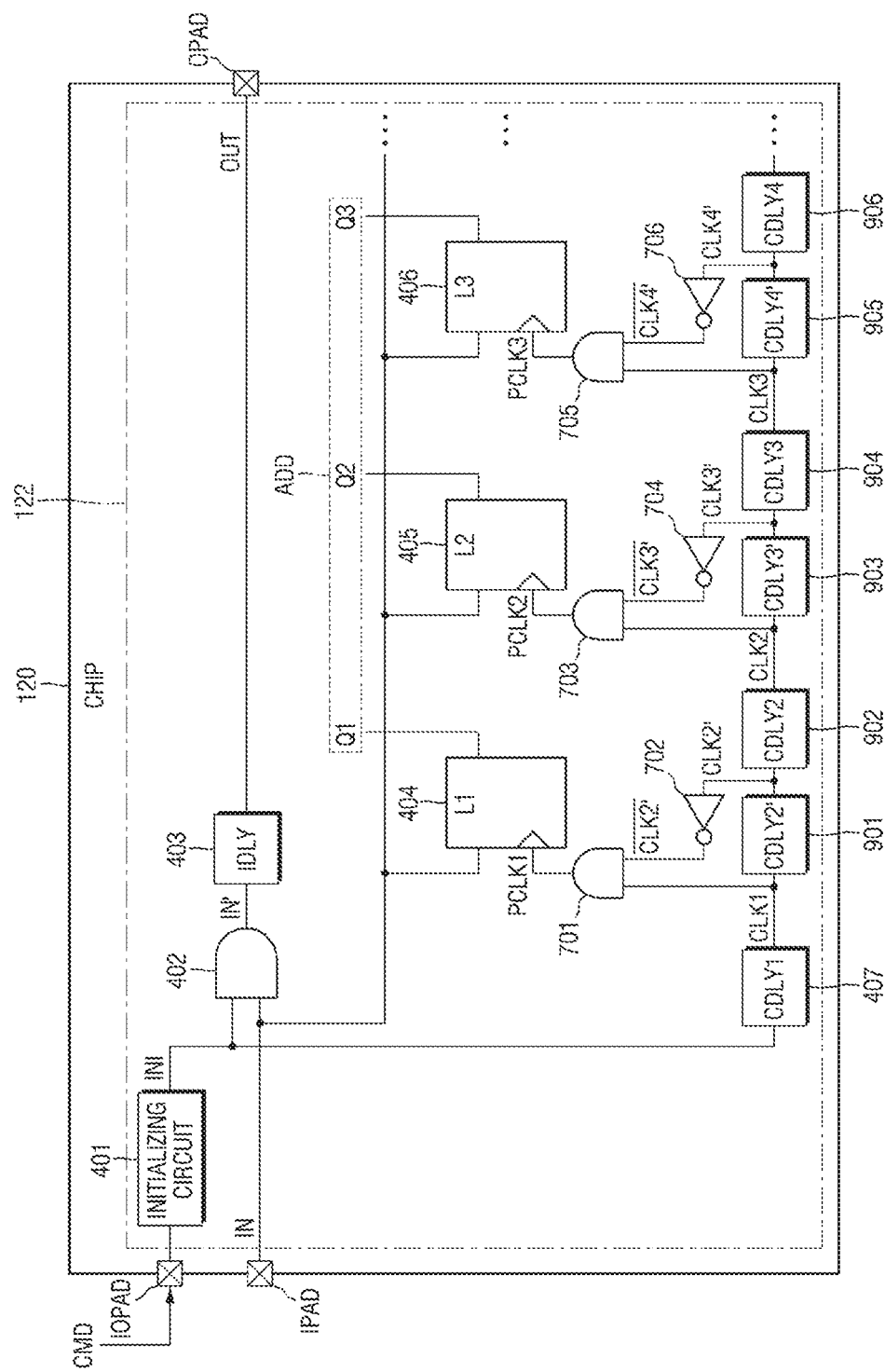
FIG. 9 is an example diagram for describing an address setting circuit according to some example embodiments.
Figure 10:
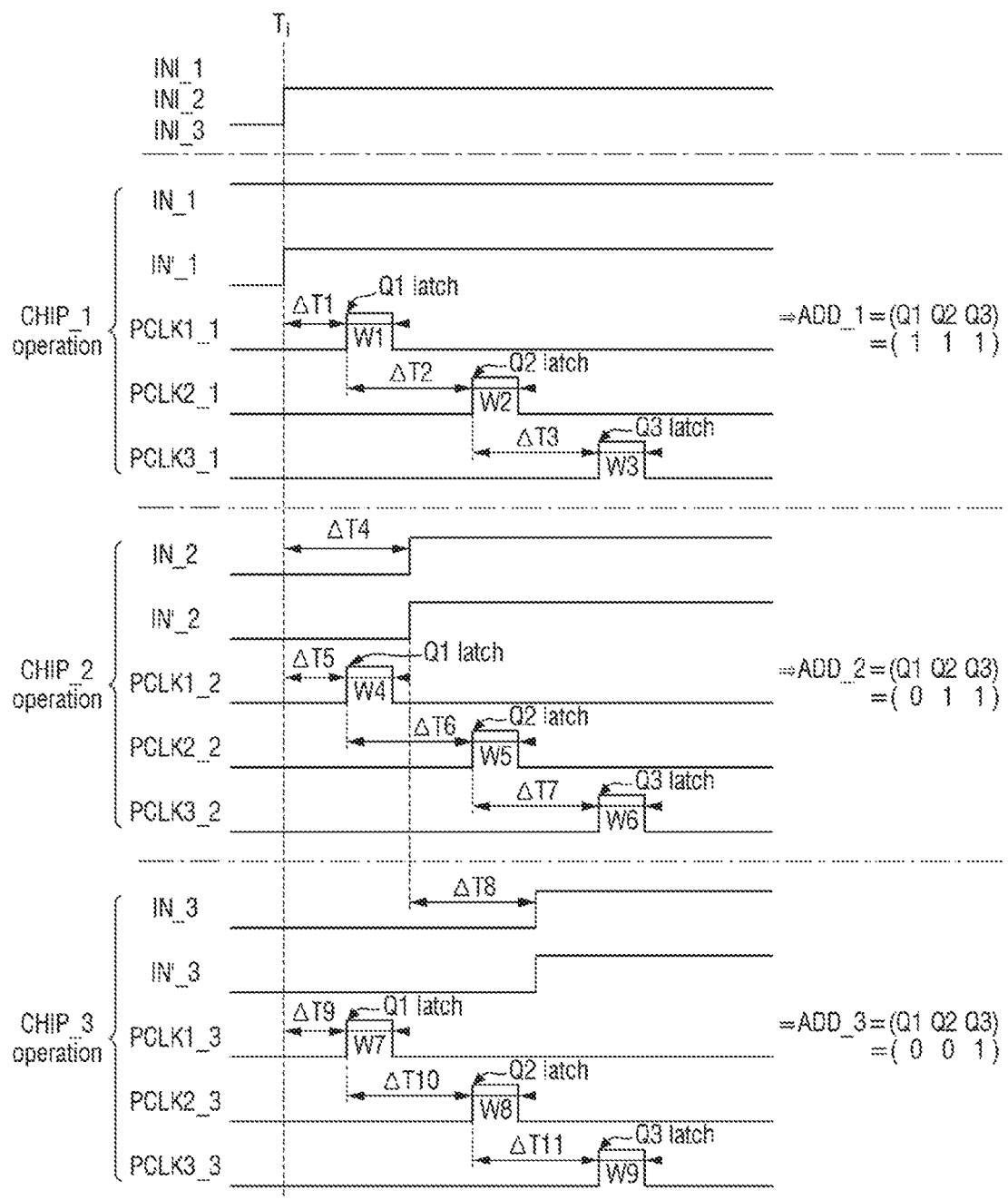
FIG. 10 is an example timing diagram for explaining the operation of the address setting circuit according to some example embodiments.

FIG. 9 is an example diagram for describing an address setting circuit according to some example embodiments. The configuration of the address setting circuit 122 illustrated in FIG. 9 may be similarly applied to all the first address setting circuit 122_1 to the third address setting circuit 122_3. FIG. 10 is an example timing diagram for explaining the operation of the address setting circuit according to some example embodiments. For convenience of explanation, repeated contents of contents described above will be omitted or briefly explained.

Referring to FIGS. 9 and 10, the address setting circuit 122 according to some example embodiments may include an initializing circuit 401, a first AND gate 402, a second AND gate 701, a third AND gate 703, a fourth AND gate 705, an input delay circuit 403, a first latch 404, a second latch 405, a third latch 406, a first clock delay circuit 407, a first sub-clock delay circuit 901, a second sub-clock delay circuit 902, a third sub-clock delay circuit 903, a fourth sub-clock delay circuit 904, a fifth sub-clock delay circuit 905, a sixth sub-clock delay circuit 906, a first inverter 702, a second inverter 704, and a third inverter 706.

The first clock delay circuit 407 may generate the first clock signal CLK1 by delaying the initializing signal INI. The first sub-clock delay circuit 901 may generate the first sub-clock signal CLK2' by delaying the first clock signal CLK1. The second sub-clock delay circuit 902 may generate the second clock signal CLK2 by delaying the first sub-clock signal CLK2'. The third sub-clock delay circuit 903 may generate the second sub-clock signal CLK3' by delaying the second clock signal CLK2. The fourth sub-clock delay circuit 904 may generate the third clock signal CLK3 by delaying the second sub-clock signal CLK3'. The fifth sub-clock delay circuit 905 may generate the third sub-clock signal CLK4' by delaying the third clock signal CLK3.

The first inverter 702 may invert the first sub-clock signal CLK2' to generate an inverted signal $\overline{CLK2'}$ of the first sub-clock signal. The second inverter 704 may invert the second sub-clock signal CLK3' to generate an inverted signal $\overline{CLK3'}$ of the second sub-clock signal. The third inverter 706 may invert the third sub-clock signal CLK4' to generate an inverted signal $\overline{CLK4'}$ of the third sub-clock signal.

The second AND gate 701 may perform AND gating of the first clock signal CLK1 and the inverted signal $\overline{CLK2'}$ of the first sub-clock signal to generate a first pulse clock signal PCLK1. The third AND gate 703 may perform AND gating of the second clock signal CLK2 and the inverted signal $\overline{CLK3'}$ of the second sub-clock signal to generate a second pulse clock signal PCLK2. The fourth AND gate 705 may perform AND gating of the third clock signal CLK3 and the inverted signal $\overline{CLK4'}$ of the third sub-clock signal to generate a third pulse clock signal PCLK3.

The time point at which the first pulse clock signal PCLK1_1 falls may precede the time point at which the level of the second_1 pulse clock signal PCLK2_1 rises. Similarly, the time point at which the level of the second_1 pulse clock signal PCLK2_1 falls may precede the time point at which the level of the third_1 pulse clock signal PCLK3_1 rises. Similarly, the time point at which the level of the first_2 pulse clock signal PCLK1_2 falls may precede the time point at which the level of the second_2 pulse clock signal PCLK2_2 rises. Similarly, the time point at which the level of the second_2 pulse clock signal PCLK2_2 falls may precede the time point at which the level of the third_2 pulse clock signal PCLK3_2 rises. Further, the time point at which the level of the first_3 pulse clock signal PCLK1_3 falls may precede the time point at which the level of the second_3 pulse clock signal PCLK2_3 rises, and the time point at which the level of the second_3 pulse clock signal PCLK2_3 rises may precede the time point at which the level of the third_3 pulse clock signal PCLK3_3 rises. That is, the first width W1 to the ninth width W9 may be smaller than the delay times of the second clock delay circuit 408 to the fourth clock delay circuit 410 of FIG. 7.

Each of the latches included in the first address setting circuit 122_1 to the third address setting circuit 122_3 may store the input signal at the time when the levels of the first_1 pulse clock signal PCLK1_1, the second_1 pulse clock signal PCLK2_1, the third_1 pulse clock signal PCLK3_1, the first_2 pulse clock signal PCLK1_2, the second_2 pulse clock signal PCLK2_2, the third_2 pulse clock signal PCLK3_2, the first_3 pulse clock signal PCLK1_3, the second_3 pulse clock signal PCLK2_3 and the third_3 pulse clock signal PCLK3_3 change from the logic low level to the logic high level. Even though it is not illustrated, the address setting circuit 122 according to some example embodiments may store the level of the initialized input signal IN' at the time point when the levels of the first pulse clock signal PCLK1 to the third pulse clock signal PCLK3 change. Those having ordinary skill in the technical field of the present inventive concepts may change the circuit configuration in various ways.

Figure 11:
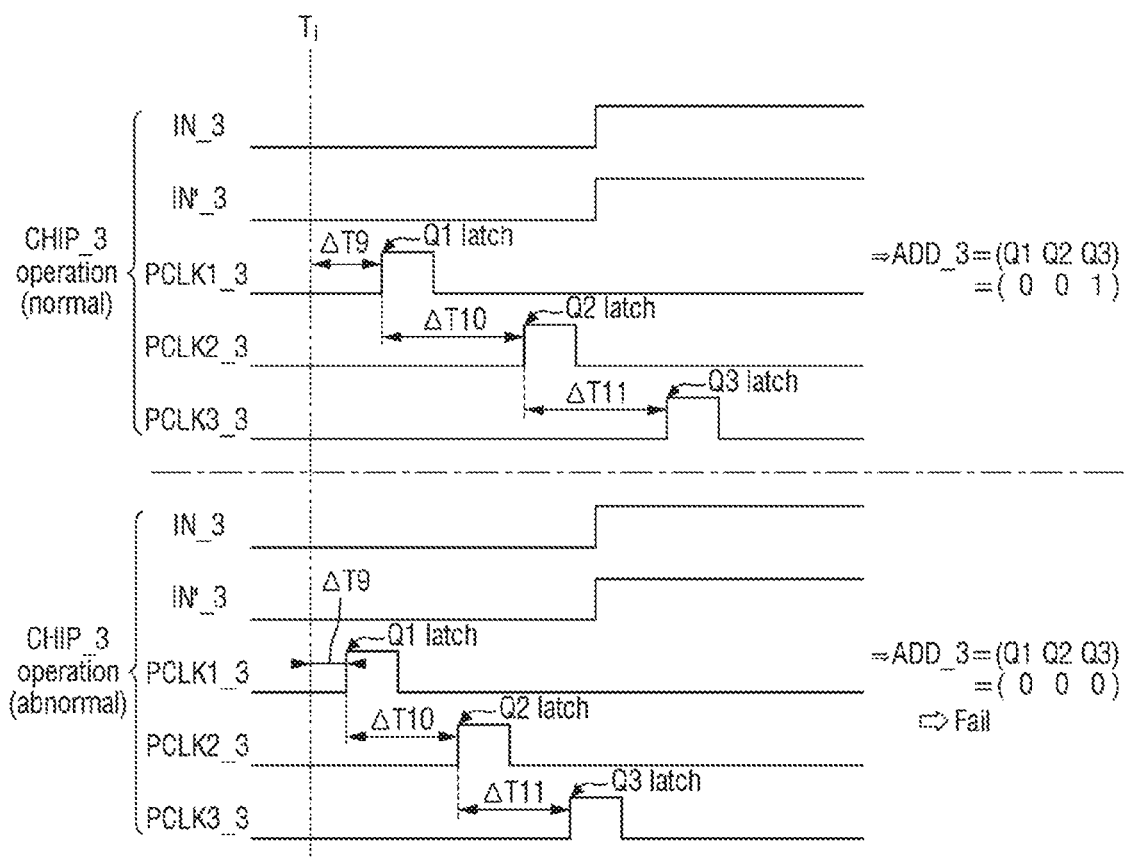
FIG. 11 is an example diagram for explaining a case where the address setting circuit according to some example embodiments operates abnormally.

FIG. 11 is an example diagram for explaining a case where the address setting circuit according to some example embodiments operates abnormally. FIG. 11 assumptively illustrates a case in which an error occurs in the first clock delay circuit 407 included in the third address setting circuit 122_3 and the first clock delay circuit 407 to the sixth sub-clock delay circuit 901.

Referring to FIGS. 3, 9, and 11, a case in which the delay times of the first clock delay circuit 407 and the first sub-clock delay circuit 901 to the sixth sub-clock delay circuit 906 become shorter than a preset delay time, due to external factors (e.g., a PVT variation). At this time, the third address ADD_3 which is output by the third address setting circuit 122_3 is not a target address (0 0 1), and (0 0 0) may be output. When these problems occur, since the host (200 of FIG. 1) may not recognize the change in the third address ADD_3, the third memory chip 120_3 may not be selected, and an error occurs in the operation of the storage device (100 of FIG. 1).

Figure 12:
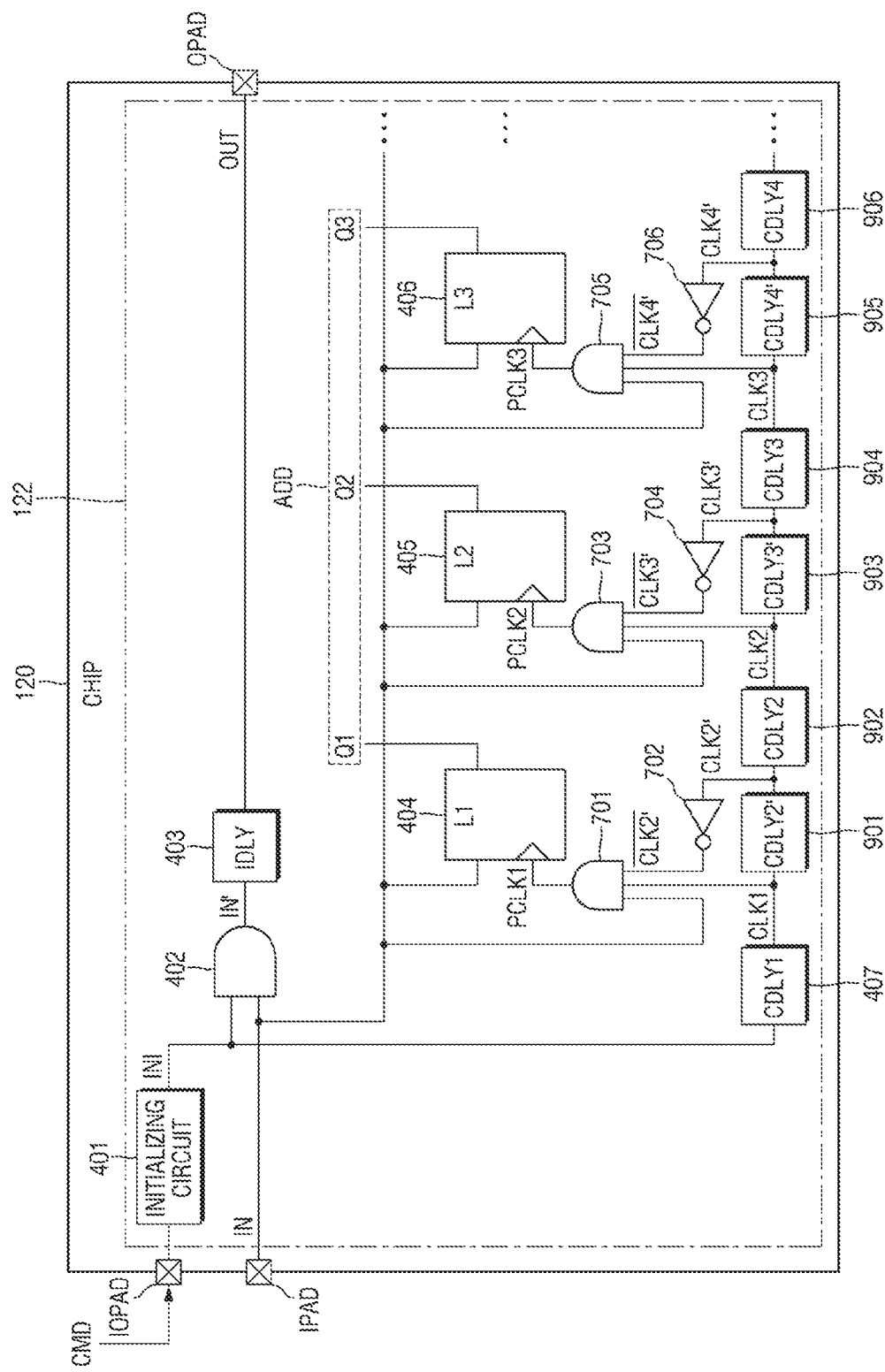
FIG. 12 is an example diagram for explaining an address setting circuit for reducing (or, alternatively, preventing) malfunction of address setting according to some example embodiments.
Figure 13:
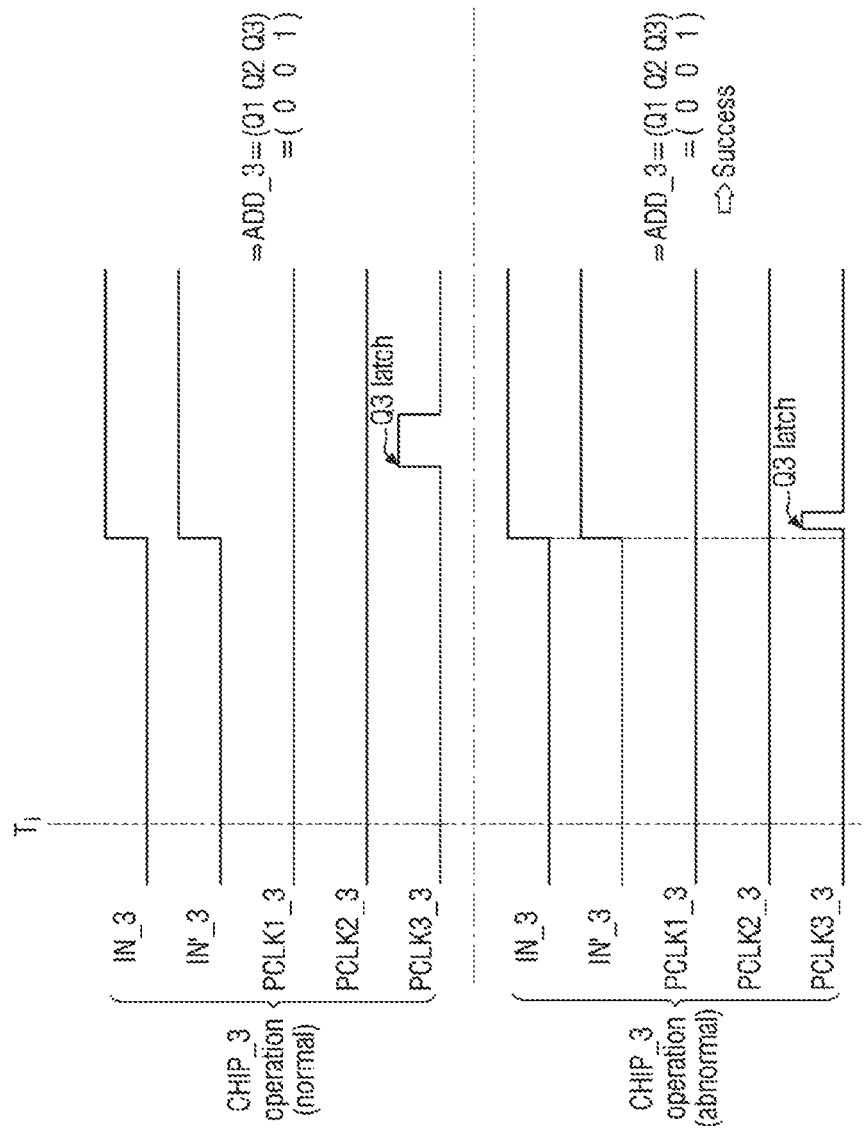
FIG. 13 is an example timing diagram for explaining the operation of the address setting circuit for reducing (or, alternatively, preventing) malfunction of address setting according to some example embodiments.

FIG. 12 is an example diagram for explaining an address setting circuit for reducing (or, alternatively, preventing) malfunction of address setting according to some example embodiments. The configuration of the address setting circuit 122 illustrated in FIG. 12 may be similarly applied to all the first address setting circuit 122_1 to the third address setting circuit 122_3. FIG. 13 is an example timing diagram for explaining the operation of the address setting circuit for reducing (or, alternatively, preventing) malfunction of address setting according to some example embodiments. For convenience of explanation, repeated contents of contents described above will be omitted or briefly explained.

Referring to FIG. 12, the second AND gate 701 may perform AND gating of the first clock signal CLK1, the inverted signal $\overline{CLK2^T}$ of the first sub-clock signal, and the input signal IN to generate the first pulse clock signal PCLK1. The third AND gate 703 may perform AND gating of the second clock signal CLK2, the inverted signal $\overline{CLK3^T}$ of the second sub-clock signal, and the input signal IN to generate the second pulse clock signal PCLK2. The fourth AND gate 705 may perform AND gating of the third clock signal CLK3, the inverted signal $\overline{CLK4^T}$ of the third sub-clock signal and the input signal IN to generate the third pulse clock signal PCLK3.

The first latch 404 to the third latch 406 may initially store 0 (a logic low level), respectively. In other words, the output Q1 of the first latch, the output Q2 of the second latch, and the output Q3 of the third latch may initially be set to 0 (a logic low level). Although not illustrated in the drawings, for example, the signals stored in the first latch 404 to the third latch 406 may be initialized to 0 (a logic low level) based on the initializing signal INI. However, the example embodiments are not limited thereto, and those having ordinary skill in the technical field of the present inventive concepts may implement several embodiments of the present inventive concepts in various ways.

Referring to FIG. 13, since the level of the third input signal IN_3 is 0 (a logic low level), the levels of the first_3 pulse clock signal PCLK1_3 and the second_3 pulse clock signals PCLK2_3 may not change. Therefore, only the third_3 pulse clock signal PCLK3_3 generated after the level of the third input signal IN_3 changes to 1 (a logic high level) may be generated. At this time, since 0 (a logic low level) is stored in each of the first latch 404 and the second latch 405, the third address setting circuit 122_3 may output the third address ADD_3 to (0 0 1).

Even when the delay times of some of the delay circuits are shortened and the third address setting circuit 122_3 operates abnormally, the third_3 pulse clock signal PCLK3_3 may be generated. In other words, when there is a section in which the third_3 pulse clock signal PCLK3_3 maintains 1 (a logic high level) after the time point at which the level of the third input signal IN_3 changes to 1 (a logic high level), the third_3 pulse clock signal PCLK3_3 may still be generated. According to some example embodiments, the third_3 pulse clock signal PCLK3_3 may be generated by the fourth AND gate 705 of the third address setting circuit 122_3 which performs AND gating of the third input signal IN_3. Therefore, when the third input signal IN_3 is subjected to AND gating, since a fine delay occurs, the time point at which the level of the third_3 pulse clock signal PCLK3_3 changes becomes later than the time point at which the level of the third input signal IN_3 changes. In other words, since the third latch 406 of the third address setting circuit 122_3 stores the level of the third input signal IN_3 after the time point at which the level of the third input signal IN_3 changes, the third address setting circuit 122_3 may successfully output the third address ADD_3 to (0 0 1).

Figure 14:
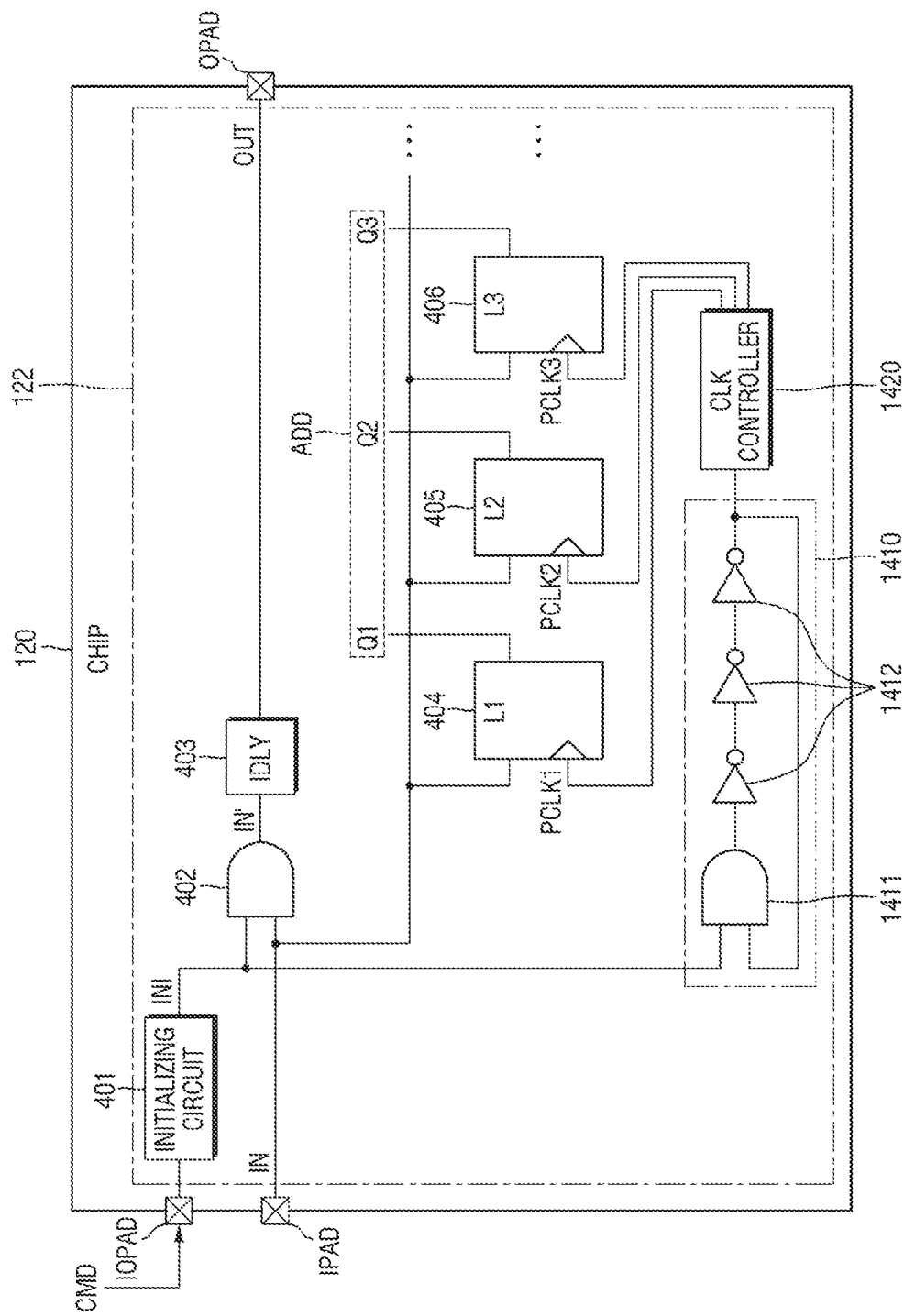
FIG. 14 is an example diagram for explaining an address setting circuit according to some example embodiments.

FIG. 14 is an example diagram for explaining an address setting circuit according to some example embodiments. For convenience of explanation, repeated contents of contents described above will be omitted or briefly explained. An address setting circuit 122 according to some example embodiments may include an initializing circuit 401, a first AND gate 402, a first latch 404, a second latch 405, a third latch 406, a ring oscillator 1410, and a clock controller 1420.

The ring oscillator 1410 may include a fifth AND gate 1411, and an odd number of fourth inverters 1412. The ring oscillator 1410 may generate a first pulse clock signal PCLK1, a second pulse clock signal PCLK2, and a third pulse clock signal PCLK3.

The clock controller 1420 may provide the pulse clock generated by the ring oscillator 1410 to the first latch 404 to the third latch 406, respectively. In other words, the clock controller 1420 may provide the first pulse clock signal PCLK1 to the first latch 404, may provide the second pulse clock signal PCLK2 to the second latch 405, and may provide the third pulse clock signal PCLK3 to the third latch 406. For example, the clock controller 1420 may determine the signal of the first cycle of the ring oscillator 1410 as the first pulse clock signal PCLK1, may determine the signal of the second cycle as the second pulse clock signal PCLK2, and may determine the signal of the third cycle as the third pulse clock signal PCLK3. The first pulse clock signal PCLK1 to the third pulse clock signal PCLK3 may be pulse clock signals having delay times different from each other. For example, the first pulse clock signal PCLK1 may precede the second pulse clock signal PCLK2, and the second pulse clock signal PCLK2 may precede the third pulse clock signal PCLK3. According to some example embodiments, even when the number of latches included in the address determination circuit increases (that is, when the number of memory chips increases), since the number of ring oscillators 1410 does not increase, it may be advantageous in terms of size reduction and cost of the memory chip 120.

Figure 15:
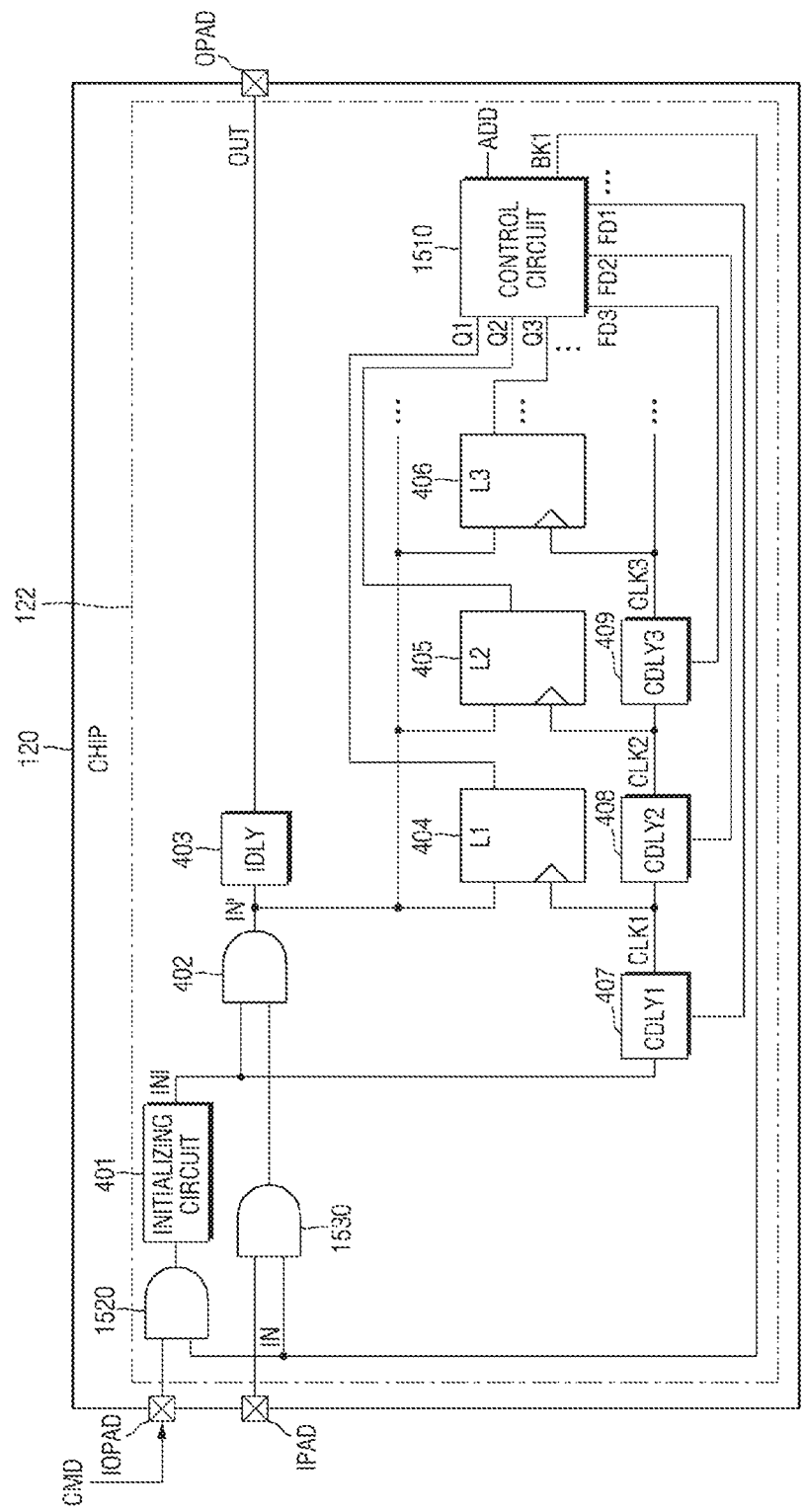
FIG. 15 is an example diagram for describing the address setting circuit according to some example embodiments.
Figure 16:
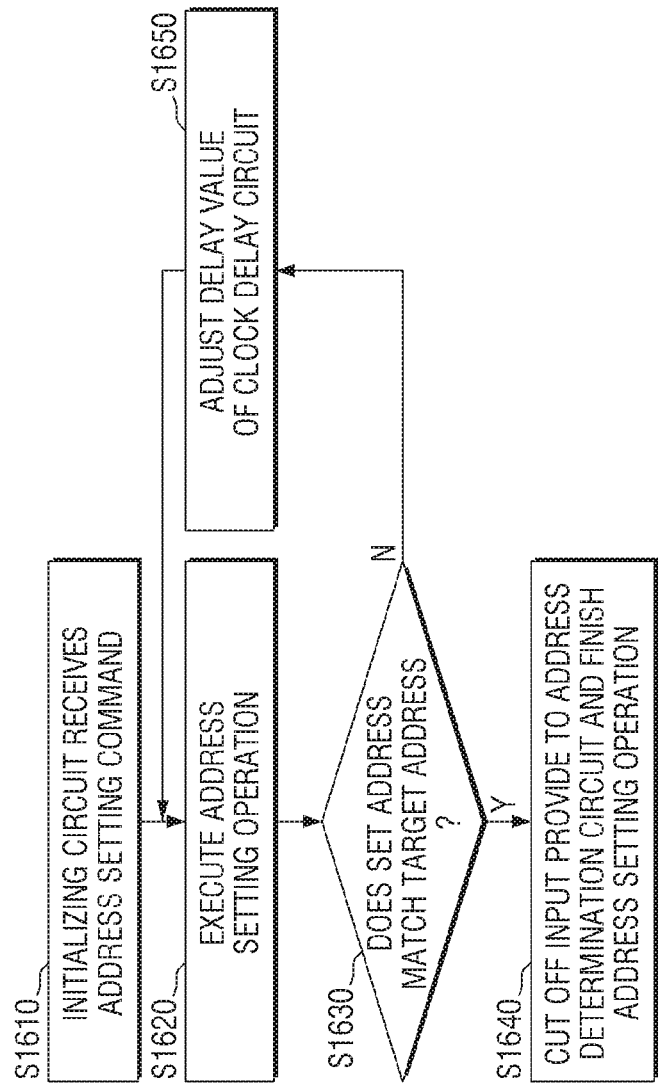
FIG. 16 is an example flowchart for explaining the operation of the address setting circuit according to some example embodiments.

FIG. 15 is an example diagram for describing the address setting circuit according to some example embodiments. FIG. 16 is an example flowchart for explaining the operation of the address setting circuit according to some example embodiments. Even though FIG. 15 illustrates that the address setting circuit of FIG. 4 further includes a sixth AND gate 1520, a seventh AND gate 1530, and a control circuit 1510, the example embodiments are not limited thereto. For example, the address setting circuit described with reference to FIGS. 6, 7, 9, 12, and 14 may further include the sixth AND gate 1520, the seventh AND gate 1530, and the control circuit 1510. For convenience of explanation, repeated contents of contents described above will be omitted or briefly explained.

Referring to FIGS. 15 and 16, the address setting circuit 122 may include an initializing circuit 401, a first AND gate 402, a sixth AND gate 1520, a seventh AND gate 1530, an input delay circuit 403, a first latch 404, a second latch 405, a third latch 406, a control circuit 1510, a first clock delay circuit 407, a second clock delay circuit 408, and a third clock delay circuit 409.

The sixth AND gate 1520 may perform AND gating of the address setting command CMD transmitted through the I/O pad IOPAD and the input block signal BK1 of the control circuit 1510, and may output them to the initializing circuit 401. The seventh AND gate 1530 may perform AND gating of the input signal IN and the input block signal BK1 and provide them to the first AND gate 402.

The control circuit 1510 receives the output Q1 of the first latch, the output Q2 of the second latch and the output Q3 of the third latch as the input, and may output the address ADD, the input block signal BK1, the first delay feedback signal FD1, the second delay feedback signal FD2, and the third delay feedback signal FD3.

In operation S1610, the initializing circuit 401 may receive the address setting command CMD, and, in operation S1620, the address setting circuit 122 may execute the address setting operation described above. According to some example embodiments, the input block signal BK1 of the control circuit 1510 may have 1 (a logic high level) as an initial value.

In operation S1630, the control circuit 1510 may compare the address which is set via the address setting operation with the target address. For example, the control circuit 1510 may compare the target address with the output Q1 of the first latch, the output Q2 of the second latch and the output Q3 of the third latch.

If the set address matches the target address, in operation S1640, the control circuit 1510 outputs the set address ADD, cuts off the signal which is input to the address setting circuit 122, and may finish the address setting operation.

For example, the control circuit 1510 may output 0 (a logic low level) to the input block signal BK1 to cut off the signal which is input to the address setting circuit 122. Therefore, all the inputs which are input to the address setting circuit 122 are cut off by the sixth AND gate 1520 and the seventh AND gate 1530 to minimize external influences (for example, PVT variation). In some example embodiments, a match between the set address and the target address may mean a case in which the set address is a success code (e.g., 1 1 1).

In operation S1650, if the set address does not match the target address, the control circuit 1510 may adjust the delay time of the first clock delay circuit 407 to the third clock delay circuit 409.

For example, the control circuit 1510 may transmit the first delay feedback signal FD1 through the third delay feedback signal FD3 to the first clock delay circuit 407 through the third clock delay circuit 40, thereby adjusting the delay times of the first clock delay circuit 407 to the third clock delay circuit 409. The first clock delay circuit 407 to the third clock delay circuit 409 which receive the first delay feedback signal FD1 to the third delay feedback signal FD3 may increase or decrease respective delay times. In some example embodiments, a mismatch between the set address and the target address may mean a case in which the set address is a fail code (e.g., 0 0 0).

According to some example embodiments, the success code may be a code which is predetermined (or desired) for use as the address of the memory chip 120, and the fail code may mean another code rather than the success code.

After the control circuit 1510 adjusts the delay time of the first clock delay circuit 407 to the third clock delay circuit 409, the address setting circuit 122 may perform the address setting operation again (S1620).

Figure 17:
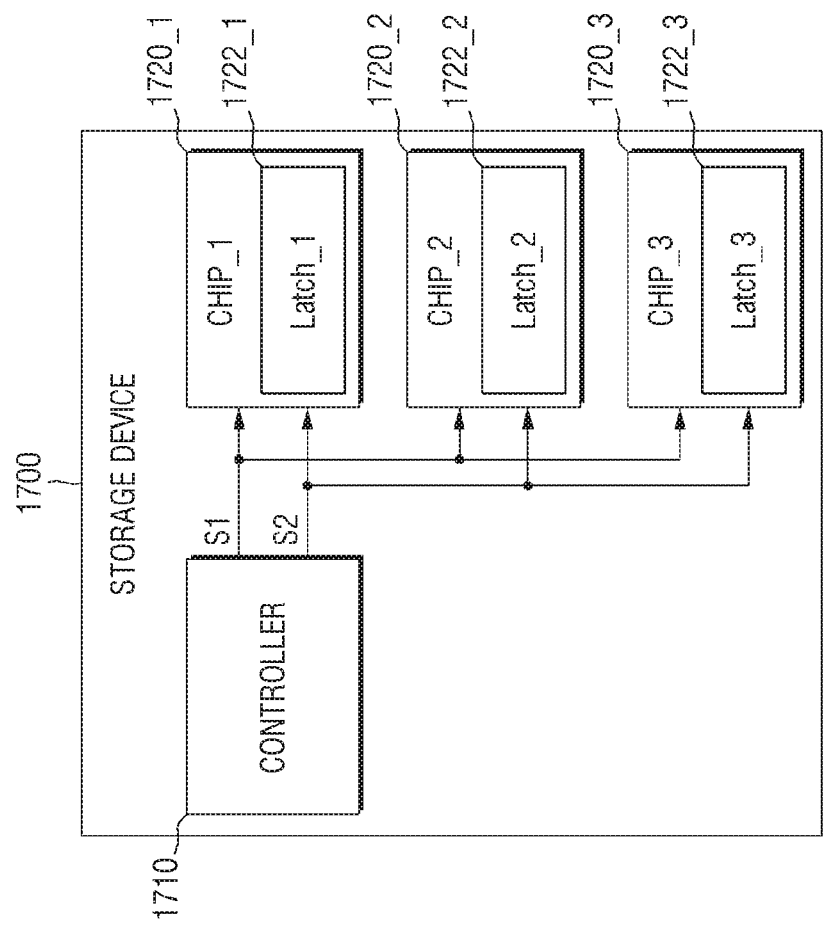
FIG. 17 is an example diagram for explaining a modified example of the storage device according to some example embodiments.

FIG. 17 is an example diagram for explaining a modified example of the storage device according to some example embodiments.

Referring to FIG. 17, the storage device 1700 may include a controller 1710, a first memory chip 1720_1, a second memory chip 1720_2, and a third memory chip 1720_3.

The first memory chip 1720_1 may include a first latch 1722_1. The second memory chip 1720_2 may include a second latch 1722_2. The third memory chip 1720_3 may include a third latch 1722_3. The controller 1710 may provide a first signal S1 to each of the first memory chip 1720_1 to the third memory chip 1720_3. The time points at which the first signal S1 is applied to the first memory chip 1720_1 to the third memory chip 1720_3 may be different from each other. For example, the time point at which the first signal S1 is applied to the first memory chip 1720_1 may precede the time point at which the first signal S1 is applied to the second memory chip 1720_2. For example, the time point at which the first signal S1 is applied to the second memory chip 1720_2 may precede the time point at which the first signal S1 is applied to the second memory chip 1720_2.

The controller 1710 may provide a second signal S2 to each of the first memory chip 1720_1 to the third memory chip 1720_3. The time points at which the second signal S2 is applied to the first memory chip 1720_1 to the third memory chip 1720_3 may be substantially identical to each other. In other words, the second signal S2 may be provided substantially simultaneously to the first memory chip 1720_1 to the third memory chip 1720_3. The first latch 1722_1 included in the first memory chip 1720_1 may store the first signal S1 based on the second signal S2. For example, the first latch 1722_1 may store the level of the first signal S1 at the time point when the level of the second signal S2 changes. The second latch 1722_2 included in the second memory chip 1720_2 may store the first signal S1 based on the second signal S2. For example, the second latch 1722_2 may store the level of the first signal S1 at the time point when the level of the second signal S2 changes. The third latch 1722_3 included in the third memory chip 1720_3 may store the first signal S1 based on the second signal S2. For example, the third latch 1722_3 may store the level of the first signal S1 at the time point when the level of the second signal S2 changes.

Since the first signal S1 may be provided to the first memory chip 1720_1 to the third memory chip 1720_3 at different time points, the levels of the first signals S1 stored in the first latch 1722_1 to the third latch 1722_3 may be different from each other. According to some example embodiments, the levels of the first signals S1 stored in the first latch 1722_1 to the third latch 1722_3 may be the address information of the respective memory chips.

Figure 18:
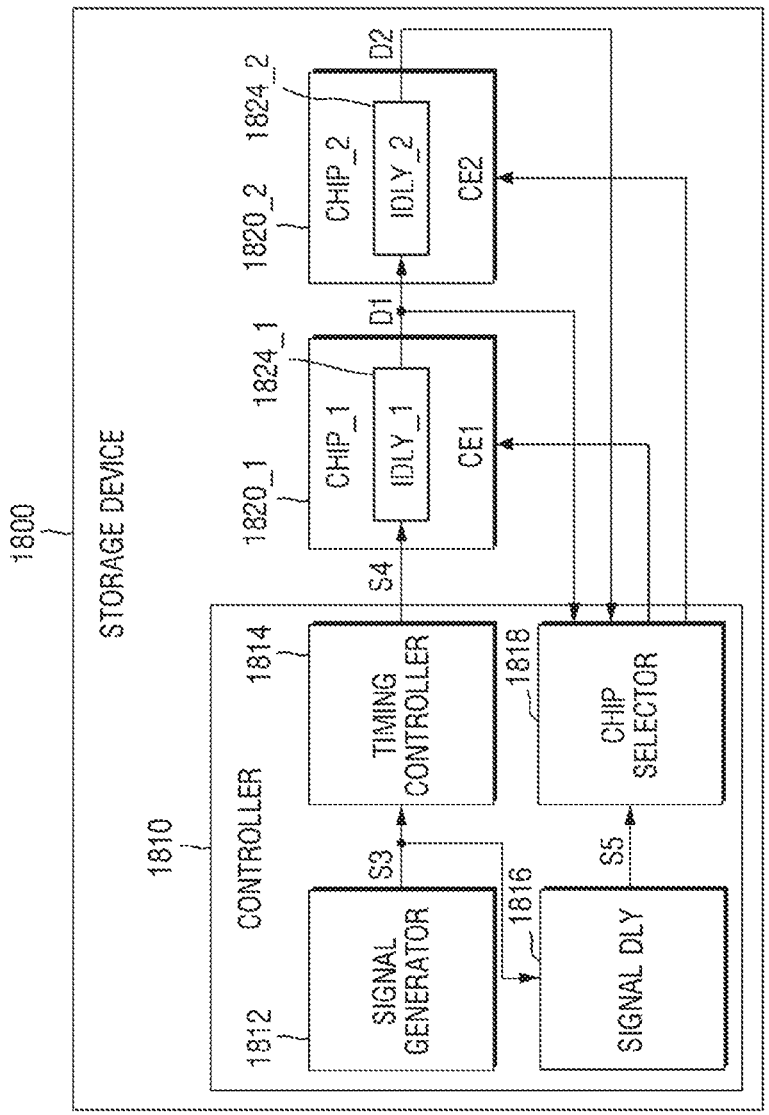
FIG. 18 is an example diagram for explaining a modified example of the storage device according to some other example embodiments.

FIG. 18 is an example diagram for explaining a modified example of the storage device according to some other example embodiments.

Referring to FIG. 18, the storage device 1800 may include a controller 1810, a first memory chip 1820_1, and a second memory chip 1820_2. According to some example embodiments, the controller 1810 may include a signal generator 1812, a timing controller 1814, a signal delay circuit 1816 and a chip selector 1818. The first memory chip 1820_1 may include a first input delay circuit 1824_1, and the second memory chip 1820_2 may include a second input delay circuit 1824_2. Each of the first memory chip 1820_1 and the second memory chip 1820_2 may include chip enable terminals CE1 and CE2.

The signal generator 1812 may generate a third signal S3. The generated third signal S3 may be provided to the timing controller 1814 and the signal delay circuit 1816. The timing controller 1814 may delay the third signal S3 by the twelfth time and provide it to the first memory chip 1820_1 as the fourth signal S4. The twelfth time is a variable time, and the timing controller 1814 may determine the twelfth time based on the command from the host. The signal delay circuit 1816 may delay the third signal S3 by the thirteenth time, which is larger than the twelfth time, and provide it to the chip selector 1818 as the fifth signal S5. The first input delay circuit 1824_1 may receive the fourth signal S4, delay the fourth signal S4, and provide it to the second input delay circuit 1824_2 as the first delay signal D1. The second input delay circuit 1824_2 may receive the first delay signal D1 and delay the first delay signal D1 to generate the second delay signal D2. The chip selector 1818 may compare the fifth signal S5 with the first delay signal D1 and the second delay signal D2 to provide the chip enable signal to the chip enable terminal (CE1 or CE2) of the first memory chip 1820_1 or the second memory chip.

For example, it is assumed that the delay value of the signal delay circuit 1816 is 10, and each of the delay values of the first input delay circuit 1824_1 and the second input delay circuit 1824_2 is 2. The timing controller 1814 may set the twelfth time to 8 in order to select the first memory chip 1820_1 in accordance with the command from the host. At this time, the fifth signal S5 obtained by delaying the third signal S3 by 10, and the first delayed signal D1 obtained by delaying the third signal S3 by 8 and 2 are substantially the same signal. Since the fifth signal S5 and the first delay signal D1 are substantially the same, the chip selector 1818 may provide the chip enable signal to the chip enable terminal CE1 of the first memory chip 1820_1.

In concluding the detailed description, those skilled in the art will appreciate that many variations and modifications may be made to the preferred embodiments without substantially departing from the principles of the present inventive concepts. Therefore, the disclosed example embodiments are used in a generic and descriptive sense only and not for purposes of limitation.

What is claimed is:

1. A first memory chip comprising:
   a first input pad configured to receive a first input signal,
   a first initializing circuit configured to generate a first initializing signal,
   a first input delay circuit configured to set a first delay time based on the first initializing signal, and to delay the first input signal by the first delay time to generate a first output signal,
   a first output pad configured to receive the first output signal and output the first output signal to outside,
   a first clock delay circuit configured to delay the first initializing signal by a second delay time to generate a first clock signal, the second delay time being different from the first delay time,
   a second clock delay circuit configured to delay the first clock signal by a third delay time to generate a second clock signal, the third delay time being different from the second delay time,
   a first latch configured to store the first input signal based on the first clock signal, and
   a second latch configured to store the first input signal based on the second clock signal.

2. The first memory chip of claim 1, further comprising:
   a first AND gate configured to perform AND gating of the first clock signal and an inverted signal of the second clock signal to generate a first pulse clock signal, wherein
   the first latch is configured to store the first input signal based on the first pulse clock signal.

3. The first memory chip of claim 1, wherein the second clock delay circuit includes a first sub-clock delay circuit and a second sub-clock delay circuit, the first sub-clock delay circuit configured to delay the first clock signal by a fourth delay time to generate a first sub-clock signal, and the second sub-clock delay circuit configured to delay the first sub-clock signal by a fifth delay time to generate the second clock signal, and the first memory chip further comprises:
   a first AND gate configured to perform AND gating of the first clock signal and an inverted signal of the first sub-clock signal to generate a first pulse clock signal, wherein
   the first latch is configured to store the first input signal based on the first pulse clock signal.

4. The first memory chip of claim 3, wherein the fourth delay time is less than the fifth delay time.

5. The first memory chip of claim 3, wherein the first AND gate is configured to perform AND gating of the first input signal, the first clock signal, and the inverted signal of the first sub-clock signal to generate the first pulse clock signal.

6. The first memory chip of claim 1, wherein the first delay time is substantially same as the third delay time.

7. The first memory chip of claim 1, wherein the second delay time is less than each of the first delay time and the third delay time.

8. The first memory chip of claim 1, further comprising:
   a first control circuit configured to compare signals stored in the first latch and the second latch with a desired target address.

9. The first memory chip of claim 8, wherein
   the first control circuit is configured to adjust delay times of the first clock delay circuit and the second clock delay circuit in response to the signals stored in the first latch and the second latch being different from the desired target address, and
   the first control circuit is configured to output the signals stored in the first latch and the second latch as a first address of the first memory chip in response to the signals stored in the first latch and the second latch being same as the desired target address.

10. A storage device comprising:
    a controller;
    a first memory chip including a first address setting circuit configured to,
    receive an address setting command from the controller to generate a first initializing signal,
    receive a signal from outside to generate a first input signal,
    set a first delay time based on the first initializing signal,
    delay the first input signal by the first delay time to generate a first output signal,
    delay the first initializing signal by a second delay time to generate a first clock signal,
    determine a first output time point based on the first clock signal, and
    output a level of the first input signal at the first output time point as a first value of a first address of the first memory chip; and
    a second memory chip including a second address setting circuit configured to receive the first output signal from the first address setting circuit.

11. The storage device of claim 10, wherein the second delay time is less than the first delay time.

12. The storage device of claim 10, wherein the first address setting circuit is configured to, delay the first clock signal by a third delay time to generate a second clock signal, and perform AND gating of the first clock signal and an inverted signal of the second clock signal to generate a first pulse clock signal, wherein the first address setting circuit is configured to determine the first output time point as a time point at which a level of the first pulse clock signal changes.

13. The storage device of claim 10, wherein the first address setting circuit is configured to, delay the first clock signal by a third delay time to generate a first sub-clock signal, delay the first sub-clock signal by a fourth delay time to generate a second clock signal, and perform AND gating of the first clock signal and an inverted signal of the first sub-clock signal to generate a first pulse clock signal, wherein the first address setting circuit is configured to determine the first output time point as a time point at which a level of the first pulse clock signal changes.

14. The storage device of claim 13, wherein the third delay time is less than the fourth delay time.

15. The storage device of claim 10, wherein the first address setting circuit is configured to, delay the first clock signal by a third delay time to generate a first sub-clock signal, delay the first sub-clock signal by a fourth delay time to generate a second clock signal, and perform AND gating of the first clock signal, an inverted signal of the first sub-clock signal and the first input signal to generate a first pulse clock signal, wherein the first address setting circuit is configured to determine the first output time point as a time point at which the first pulse clock signal changes.

16. The storage device of claim 10, wherein the second address setting circuit is configured to, receive the address setting command from the controller to generate a second initializing signal, receive the first output signal to generate a second input signal, delay the second initializing signal by a third delay time to generate a second clock signal, determine a second output time point based on the second clock signal, and output a level of the second input signal at the second output time point as a first value of a second address of the second memory chip, wherein the first initializing signal and the second initializing signal are generated substantially simultaneously.

17. The storage device of claim 16, wherein the third delay time is substantially same as the second delay time.

18. The storage device of claim 16, wherein the third delay time is less than the first delay time.

19. A memory chip comprising:

a first input pad configured to receive a first input signal;

a first initializing circuit configured to provide a first initializing signal;

a first input delay circuit configured to delay the first input signal based on the first initializing signal;

a first ring oscillator configured to generate a first clock signal and a second clock signal such that the second clock signal is the first clock signal delayed by a first time;

a first latch configured to store the first input signal based on the first clock signal;

a second latch configured to store the first input signal based on the second clock signal; and a first clock controller configured to provide the first clock signal and the second clock signal to the first latch and the second latch, respectively.

* * * * *